(12) United States Patent
Miya et al.

(10) Patent No.: US 8,178,222 B2
(45) Date of Patent: May 15, 2012

(54) DECORATIVE PART AND PROCESS FOR PRODUCING THE SAME

(75) Inventors: Yukio Miya, Kawagoe (JP); Koichi Naoi, Kawagoe (JP); Osamu Tanaka, Kodaira (JP); Yoshitsugu Shibuya, Toda (JP); Junji Sato, Kawagoe (JP)

(73) Assignee: Citizen Holdings Co., Ltd., Tokyo (JP)

( * ) Notice: Subject to any disclaimer, the term of this patent is extended or adjusted under 35 U.S.C. 154(b) by 488 days.

(21) Appl. No.: 12/442,664

(22) PCT Filed: Sep. 25, 2007

(86) PCT No.: PCT/JP2007/068576
§ 371 (c)(1),
(2), (4) Date: Mar. 24, 2009

(87) PCT Pub. No.: WO2008/041562
PCT Pub. Date: Apr. 10, 2008

(65) Prior Publication Data
US 2010/0086756 A1    Apr. 8, 2010

(30) Foreign Application Priority Data

Sep. 25, 2006 (JP) ................................ 2006-258425
Mar. 2, 2007 (JP) ................................ 2007-053139

(51) Int. Cl.
*B32B 9/00* (2006.01)
(52) U.S. Cl. ............. 428/698; 204/192.15; 204/193.16; 428/216; 428/469; 428/472
(58) Field of Classification Search ............. 204/192.15, 204/192.16; 428/216, 336, 469, 472, 698
See application file for complete search history.

(56) References Cited

U.S. PATENT DOCUMENTS

| 4,415,421 A | * | 11/1983 | Sasanuma ............... 204/192.15 |
| 4,591,418 A | | 5/1986 | Snyder |
| 4,699,850 A | | 10/1987 | Kishi et al. |
| 4,791,017 A | | 12/1988 | Hofmann et al. |
| 5,752,395 A | * | 5/1998 | Nakamura ........................ 63/34 |
| 6,299,987 B1 | * | 10/2001 | Ikeda et al. ................... 428/469 |
| 7,261,956 B2 | * | 8/2007 | Kawakami et al. .......... 428/698 |
| 2003/0118858 A1 | | 6/2003 | Kushida et al. |
| 2003/0224201 A1 | * | 12/2003 | Kawakami et al. .......... 428/627 |

FOREIGN PATENT DOCUMENTS

| GB | 2172613 A | 9/1986 |
| JP | 7011462 A | 1/1995 |
| JP | 3244952 B2 | 10/2001 |
| JP | 2001294955 A | 10/2001 |
| JP | 2001301400 A | 10/2001 |
| JP | 2005119260 A | 5/2005 |

* cited by examiner

*Primary Examiner* — Archene Turner
(74) *Attorney, Agent, or Firm* — The Webb Law Firm

(57) ABSTRACT

A decorative part and a process for producing the decorative part. A first nitride layer containing at least one metal selected among hafnium, titanium, and zirconium is formed on the surface of a decorative part comprising a soft base made of a material selected among stainless steel, titanium and titanium alloys, brass, etc., and a second nitride layer containing at least one metal which is selected among hafnium, titanium, and zirconium and is different from that in the first nitride layer is formed on the first nitride layer to thereby form a primer layer. A multilayered hardened layer including a gold alloy layer is further formed as a finish layer on the primer layer.

12 Claims, 2 Drawing Sheets

[FIG. 1-1]
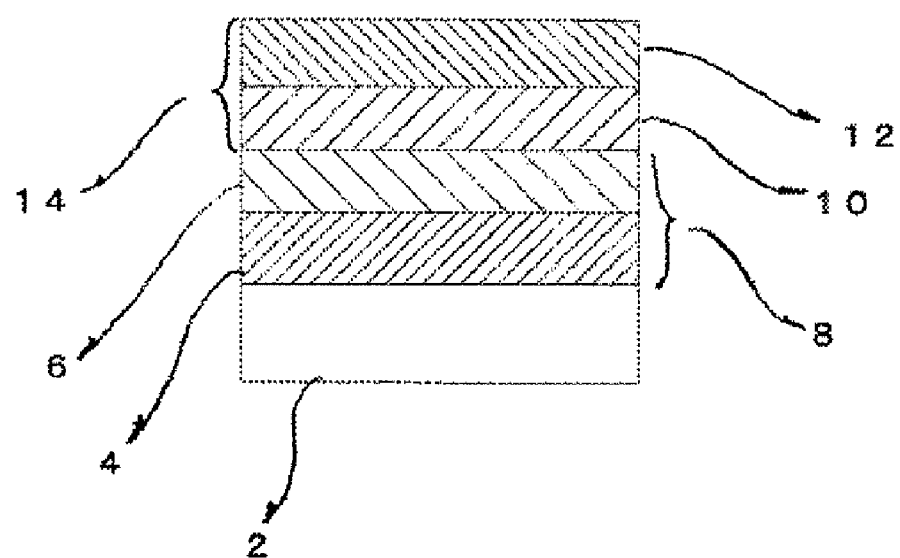

[FIG. 2-1]
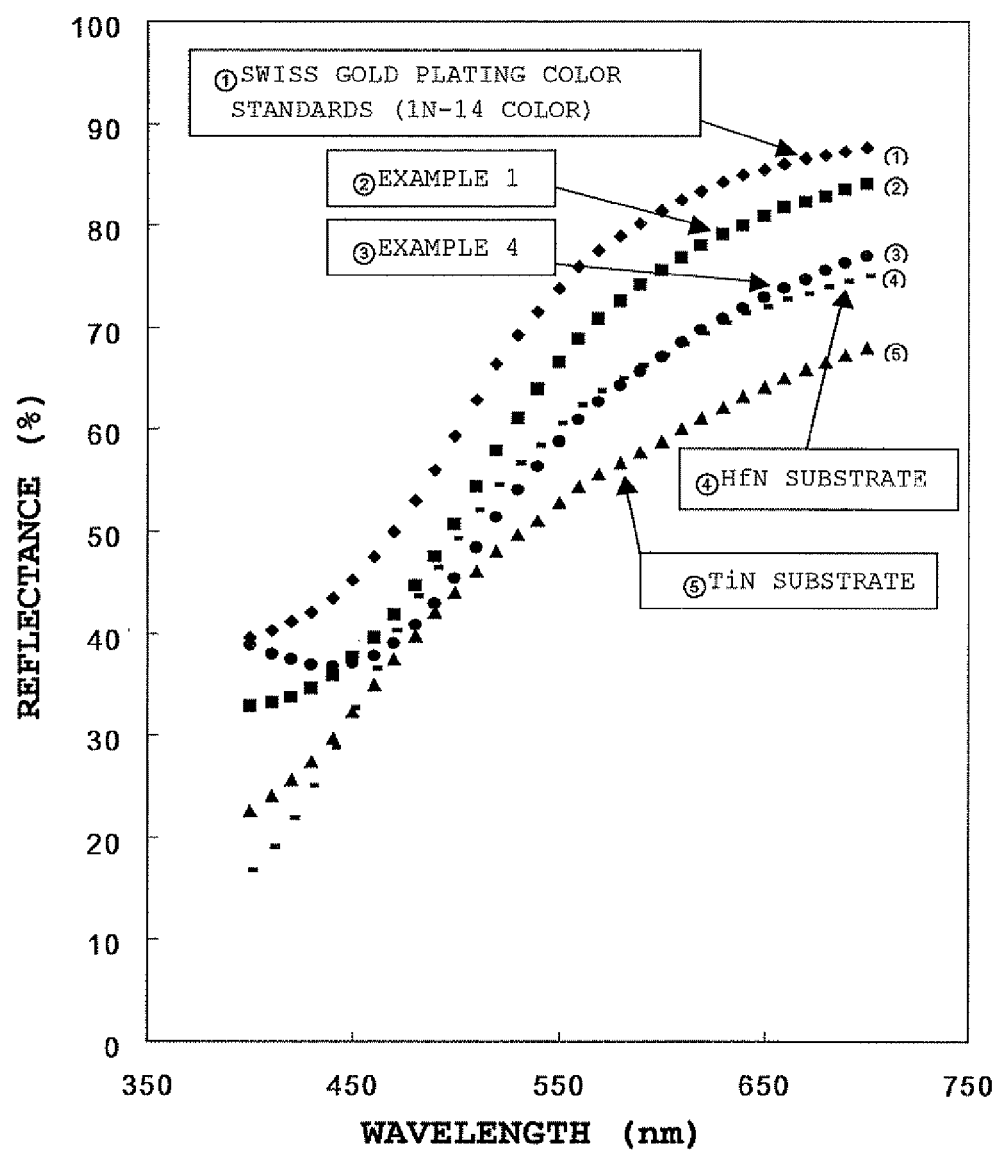

DECORATIVE PART AND PROCESS FOR PRODUCING THE SAME

TECHNICAL FIELD

The present invention relates to a decorative part and a process for producing the same. More particularly, the first invention relates to a decorative part with a hardening layer of golden color tone containing gold at its surface. The second invention relates to a decorative piece with a golden coating and a process for producing the same, and further particularly relates to a golden decorative part capable of retaining its golden beauty over a prolonged period of time and a process for producing the same.

BACKGROUND ART

The decorative part, such as any of watch external parts including a watchband, a watchcase, a bezel, a caseback, an intermediate clasp, a buckle and a winding stem (winding crown), a piercing jewelry, an earring, a finger ring, a spectacle frame, a pendant, a brooch, a necklace or a bracelet, has a layer structure using various materials.

For example, a stainless material, Ti, a Ti alloy, brass and the like being soft materials whose machining into parts is easy are widely employed as a base material. However, it is pointed out that the decorative parts obtained by machining these soft base materials are likely to suffer degradation of the external appearance quality thereof due to marring during use, etc., posing a grave problem. The cause thereof is principally the lowness of the surface hardness of the soft base materials per se, for example, Hv=200 or so in terms of Vickers hardness. With a view toward solving this problem, various surface hardening treatments are being tested.

Further, for the above-mentioned decorative parts, such as any of watch external parts including a watchband, a watchcase, a bezel, a caseback, an intermediate clasp, a buckle and a winding stem (winding crown), a piercing jewelry, an earring, a finger ring, a spectacle frame, a pendant, a brooch, a necklace and a bracelet, high embellishing performance and external appearance quality are demanded. Accordingly, especially various surface hardening treatment technologies ensuring a luxurious golden color tone are being tested.

The methods for hardening a soft base material include the method of forming a coating on the surface of the soft base material and the method of hardening the soft base material per se.

As the method of forming a golden coating on the surface of the soft base material, there can be mentioned, for example, wet plating and ion plating methods. Although especially, Au plating, Au—Ni plating, Au—Pd plating and the like are widely carried out for decorative parts, all the plated coatings are soft and do not succeed in resolving the marring during use. Further, with respect to ion plating, although there can be mentioned techniques of forming a titanium nitride coating or the like, the titanium nitride coating has the drawback of, due to its high internal stress, having poor adhesion and tending to suffer peeling, and the techniques without exception do not succeed in completely overcoming the coating peeling problem. Moreover, in the event of peeling, there would occur exposure of the soft material per se where corrosion would occur to thereby disenable use as the part.

Although ion injection, ion nitriding, gas nitriding and the like are known as providing the method of hardening a decorative part consisting of a material, such as a stainless material, Ti, a Ti alloy or brass, all such means would need not only prolonged hardening treatment time leading to poor productivity but also high treatment temperature so that crystal grains of the decorative part would coarsen resulting in surface roughening to thereby markedly degrade the external appearance quality thereof. Especially, the problem of surface roughening is serious. When the decorative part having undergone mirror surface polishing treatment is subjected to gas nitriding or carburizing treatment, the crystal grains of the decorative part surface after the treatment would be coarse so as to induce a surface roughening of 200 to 300 μm. The mirror surface would disappear, and even when post-polishing is performed, the mirror surface condition before the carburizing treatment could no longer be recovered to thereby cause marked drop or deterioration of the external appearance quality thereof.

Furthermore, for providing a golden decorative part, it is proposed to superimpose an Au alloy top layer (finish layer) consisting of three elements, particularly 94.0 to 98.5 wt. % Au, 1.0 to 3.0 wt. % Fe and 0.5 to 3.0 wt. % Pd, on a nitride of at least one element selected from among Ti, Zr, Hf and Ta (see, for example, the following patent literature (1) or patent literature (2)). (The above is the background art of the first invention.)

As aforementioned, decorative parts, such as a watchband and other watch parts, a finger ring, a necklace and an earring, are provided at the outermost layer thereof with a gold coating by a wet or dry plating method to thereby impart premium accents or excellent corrosion resistance thereto.

As a decorative part exhibiting a golden color tone, there is disclosed a golden decorative part comprising a base material, a Ti coating containing unavoidable components (nitrogen, oxygen and carbon) formed on a surface of the base material in an inert gas other than nitrogen and an outermost layer coating formed on the Ti coating by a dry plating method wherein the outermost layer coating contains 60 to 99 at % gold, 0.5 to 20 at % iron and 0.5 to 20 at % unavoidable components (see patent literature (3)). In this prior art, the thickness of the outermost layer coating is generally in the range of 0.05 to 0.5 μm. It is also disclosed that it is preferred from the viewpoint of adhesion between the outermost layer coating and the base material that the thickness of the Ti coating generally fall within the range of 0.1 to 10 μm and that use be made of a TiN coating, HfN coating or the like. Further, it is disclosed that a Ti coating containing unavoidable components being present in a dry plating apparatus, formed in an inert gas other than nitrogen, such as argon, helium or neon, may be present as an undercoat layer (primer layer) between the base material and the TiN coating. (The above is the background art of the second invention.)

Patent literature (1): Japanese Patent No. 3244952
Patent literature (2): JP 2001-294955 A
Patent literature (3): JP 07-11462 A The technology described in the background of the first invention is directed to adding of Fe and Pd with a view toward obtaining a golden decorative part ensuring an Au color tone without inviting metal allergy and makes no mention of hardness and strength at all. The writers' follow-up test revealed that only a coating whose hardness is as low as Hv 250 or below can be obtained. Accordingly, the object of the first invention is to, with respect to a decorative part based on a soft base material, such as a stainless material, Ti, a Ti alloy or brass, provide a decorative part of golden color tone having a high hardness and high marring resistance capable of preventing marring during use and having a high corrosion resistance capable of preventing any corrosion.

In the technology described in the background of the second invention, a gold coating and a coating of gold alloy, such as gold-iron alloy, pose the problem of generally having a low hardness to thereby tend to suffer marring and spoil the beauty of decorative part. Further, when the thickness of gold alloy coating (outermost layer coating) is as large as 0.05 to 0.5 μm like that of the above-mentioned decorative part, any blemish generated in the coating would be deep so as to be easily visible to the naked eye, resulting in marked spoilage of the beauty of decorative part. Accordingly, the object of the second invention is to provide a golden decorative part that, even when a golden outermost layer coating is marred, would suppress the visibility of blemish to the naked eye, thereby ensuring retention of the golden beauty over a prolonged period of time, and to provide a process for producing the golden decorative part.

SUMMARY OF THE INVENTIOn

Various surface treatments have been studied in order to solve the problems of the first invention. As a result, it has been found that a decorative part of golden color tone having a high hardness and high marring resistance capable of preventing marring by impact and having a high corrosion resistance capable of preventing any corrosion can be obtained by superimposing a hardening layer containing Au on a surface of decorative part consisting of a soft base material, such as a stainless material, Ti, a Ti alloy or brass.

As a result of various studies on the structure of the hardening layer, it has been found that the hardening layer of golden color tone can be efficiently provided by the employment of the following structure.

A hardening layer of multilayer structure composed of an undercoat layer and a top layer is superimposed on a surface of decorative part consisting of a soft base material, such as a stainless material, Ti, a Ti alloy or brass. In a particular arrangement, the undercoat layer is constituted of a first nitride layer of at least one metal selected from among Hf, Ti and Zr and, superimposed on the first nitride layer, a second nitride layer of at least one metal selected from among Hf, Ti and Zr differing from the first nitride layer. Further, an Au alloy layer as the top layer is superimposed on the undercoat layer, thereby providing a hardening layer of multilayer structure. For obtaining a hardening layer with higher marring resistance and higher adhesion, it is preferred to increase the adhesion between the material as the base material and the first nitride layer of the undercoat layer and to increase the adhesion between the second nitride layer of the undercoat layer and the Au alloy layer as the top layer. In particular, it is preferred that a metal layer consisting of the same metal as that constituting the first nitride be interposed between the material as the base material and the first nitride layer. Also, it is preferred that the top layer include, interposed between the second nitride layer of the undercoat layer and the Au alloy layer as the top layer, a layer of mixture of an Au alloy and the same nitride as that constituting the second nitride layer.

Preferably, the Au alloy layer consists of an alloy composed mainly of an Au—Ni alloy, Au—Pd alloy or Au—Pt alloy. Further, preferably, the decorative part is any of watch external parts including a watchband, a watchcase, a bezel, a caseback, an intermediate clasp, a buckle and a winding stem (winding crown), a piercing jewelry, an earring, a finger ring, a spectacle frame, a pendant, a necklace, a bracelet or a brooch.

(Action)

There are a variety of hardening layers composed mainly of a gold alloy. The characteristics thereof without exception are that even when immersed in an acid or alkali over a prolonged period of time, they would not suffer corrosion at all and have a mechanical strength higher than that of pure Au. In a particular arrangement, the undercoat layer is constituted of a first nitride layer of at least one metal selected from among Hf, Ti and Zr and, superimposed on the first nitride layer, a second nitride layer of at least one metal selected from among Hf, Ti and Zr differing from the first nitride layer. Further, an Au alloy layer as the top layer is superimposed on the undercoat layer, thereby providing a hardening layer of multilayer structure. In another arrangement, the undercoat layer is constituted of a metal layer of at least one metal selected from among Hf, Ti and Zr, a first nitride layer of the same metal as that constituting the metal layer superimposed on the metal layer and, superimposed on the first nitride layer, a second nitride layer of at least one metal selected from among Hf, Ti and Zr differing from the first nitride layer. Further, a layer of mixture of an Au alloy and the same nitride as that constituting the second nitride layer and, super posed on the mixture layer, an Au alloy layer are provided so as to constitute the top layer on the undercoat layer, thereby providing a hardening layer of multilayer structure. The first invention solves the above-mentioned problems with the use of these characteristics. That is, according to one embodiment, the undercoat layer is constituted of a first nitride layer of at least one metal selected from among Hf, Ti and Zr and, superimposed on the first nitride layer, a second nitride layer of at least one metal selected from among Hf, Ti and Zr differing from the first nitride layer. Further, an Au alloy layer as the top layer is superimposed on the undercoat layer, thereby providing a hardening layer of multilayer structure. According to another embodiment, the undercoat layer is constituted of a metal layer of at least one metal selected from among Hf, Ti and Zr, a first nitride layer of the same metal as that constituting the metal layer superimposed on the metal layer and, superimposed on the first nitride layer, a second nitride layer of at least one metal selected from among Hf, Ti and Zr differing from the first nitride layer. Further, a layer of mixture of an Au alloy and the same nitride as that constituting the second nitride layer and, superimposed on the mixture layer, an Au alloy layer are provided so as to constitute the top layer on the undercoat layer, thereby providing a hardening layer of multilayer structure. As a result, a hardening layer with enhanced hardness and enhanced marring resistance can be provided, so that a decorative part having a high hardness and high marring resistance capable of preventing marring by impact and having a high corrosion resistance can be obtained.

Extensive and intensive studies made with a view toward solving the problems mentioned with respect to the second invention have led to finding of a golden decorative part characterized by having:

a base material for decorative piece, a golden hard coating exhibiting a golden color tone provided on the base material for decorative piece, and a golden outermost coating of gold (Au) or gold alloy exhibiting a golden color tone provided on the golden hard coating, wherein the golden hard coating is harder than the golden outermost coating, and wherein the golden outermost coating has a thickness of 0.005 to 0.04 μm.

It has been found that this golden decorative part, even when the outermost layer coating is marred, would suppress the visibility of blemish to the naked eye, thereby ensuring retention of the golden beauty over a prolonged period of time, and that the golden decorative part exhibits a bright luxurious golden color tone, excelling in corrosion resistance. On the basis of these findings, the second invention has been completed.

The golden hard coating preferably consists of hafnium nitride (HfN) or zirconium nitride (ZrN).

Preferably, the golden outermost coating contains as a major component at least one member selected from the group consisting of a gold-nickel (Au—Ni) alloy, a gold-palladium (Au—Pd) alloy, a gold-platinum (Au—Pt) alloy and a gold-rhodium (Au—Rh) alloy.

Also preferably, the golden outermost coating has a thickness of 0.02 to 0.04 μm.

Further preferably, the golden outermost coating has a thickness of 0.02 to 0.03 μm.

Also preferred is the golden decorative part wherein further a second hard coating is provided between the base material for decorative piece and the golden hard coating, and wherein the hardness of the second hard coating is greater than that of the golden hard coating.

It is preferred that the thickness of the second hard coating be greater than that of the golden hard coating.

Preferably, the second hard coating exhibits a golden color tone.

Also preferably, the second hard coating contains as a major component a nitride, carbide or carbonitride of at least one element selected from the group consisting of titanium (Ti), chromium (Cr), zirconium (Zr), hafnium (Hf), vanadium (V), niobium (Nb) and tantalum (Ta).

Further preferably, the second hard coating consists of titanium nitride (TiN), and the golden hard coating consists of hafnium nitride (HfN).

An undercoat layer may be provided between the base material for decorative piece and the second hard coating.

Preferably, the undercoat layer contains as a major component at least one element selected from the group consisting of titanium (Ti), chromium (Cr), zirconium (Zr), hafnium (Hf), vanadium (V), niobium (Nb) and tantalum (Ta), the element being the same as that contained in the second hard coating.

Further preferably, the undercoat layer consists of titanium (Ti), and the second hard coating consists of titanium nitride (TiN).

It is preferred that the base material for decorative piece consist of at least one metal selected from the group consisting of stainless steel, titanium, a titanium alloy, copper, a copper alloy and tungsten carbide.

Preferably, the base material for decorative piece consists of ceramic.

As the process for producing the golden decorative part exhibiting a golden color tone according to the second invention, there is provided a process for producing a golden decorative part furnished as a golden outermost coating with a coating of gold (Au) or gold alloy exhibiting a golden color tone by the use of a dry plating method, characterized by including:

[1] the step of producing a base material for decorative piece from a metal or ceramic material by the use of various machining means,

[2] the step of forming a golden hard coating on a surface of the base material for decorative piece by the use of a dry plating method, and

[3] the step of forming a golden outermost coating of gold (Au) or gold alloy on the surface of the golden hard coating by the use of a dry plating method, so that the golden hard coating is formed so as to be harder than the golden outermost coating, and so that the golden outermost coating formed so as to have a thickness of 0.005 to 0.04 μm.

The step [2] of this process may include:

the step of by the use of a dry plating method, forming a second hard coating on a surface of the base material for decorative piece and forming a golden hard coating on the surface of the second hard coating, and

[3] the step of forming a golden outermost coating of gold (Au) or gold alloy on the surface of the golden hard coating by the use of a dry plating method, so that the second hard coating is formed so as to have a thickness greater than that of the golden hard coating.

Further, the step [2] of this process may include:

the step of by the use of a dry plating method, forming an undercoat layer on a surface of the base material for decorative piece, forming a second hard coating on the surface of the undercoat layer, and forming a golden hard coating on the surface of the second hard Coating, and

[3] the step of forming a golden outermost coating of gold (Au) or gold alloy on the surface of the golden hard coating by the use of a dry plating method.

According to the first invention, a decorative part consisting of a soft base material, such as a stainless material, Ti, a Ti alloy or brass, on the surface thereof is provided with an undercoat layer constituted of a first nitride layer of at least one metal selected from among Hf, Ti and Zr and, superimposed on the first nitride layer, a second nitride layer of at least one metal selected from among Hf, Ti and Zr differing from the first nitride layer. Further, an Au alloy layer as a top layer is superimposed on the undercoat layer, thereby providing a hardening layer of multilayer structure. By virtue of the first invention, there can be realized a decorative part of golden color tone having a high hardness, high marring resistance and high corrosion resistance capable of preventing marring by impact and preventing any corrosion. For attaining the enhancement of marring resistance and adhesion, it is preferred to increase the adhesion between the material as the base material and the first nitride layer of the undercoat layer and to increase the adhesion between the second nitride layer of the undercoat layer and the Au alloy layer as the top layer. In particular, it is preferred that a metal layer consisting of the same metal as that constituting the first nitride be interposed between the material as the base material and the first nitride layer. Also, it is preferred that the top layer include, interposed between the second nitride layer of the undercoat layer and the Au alloy layer as the top layer, a layer of mixture of an Au alloy and the same nitride as that constituting the second nitride layer. Thus, preferably, the undercoat layer includes a metal layer of at least one metal selected from among Hf, Ti and Zr, a first nitride layer of the same metal as that constituting the metal layer superimposed on the metal layer and, superimposed on the first nitride layer, a second nitride layer of at least one metal selected from among Hf, Ti and Zr differing from the first nitride layer, and the top layer on the undercoat layer includes a layer of mixture of an Au alloy and the same nitride as that constituting the second nitride layer and, superimposed on the mixture layer, an Au alloy layer, thereby providing a hardening layer of multilayer structure. As aforementioned, a decorative part of golden color tone having a high hardness, high marring resistance and high corrosion resistance capable of avoiding any blemish and preventing any corrosion can be realized, thereby attesting to striking effects as a surface hardening technique for decorative part.

In the first invention, the decorative part at its surface is furnished with the undercoat layer that is constituted of a metal layer of at least one metal selected from among Hf, Ti and Zr, a first nitride layer of the same metal as that constituting the metal layer superimposed on the metal layer, for example, a layer of HfN, TiN or ZrN and, superimposed on the first nitride layer, a second nitride layer differing from the first nitride layer, for example, a layer of HfN, TiN or ZrN. Further, the decorative part on the undercoat layer is furnished with the top layer that is constituted of a layer of mixture of an Au alloy and the same nitride as that constituting the second nitride layer, such as HfN, TiN or ZrN, and, superimposed on the mixture layer, an Au alloy layer, thereby providing a hardening layer of multilayer structure. That is, as first the metal layer of, for example, Hf, Ti or Zr is provided and thereafter the first nitride layer, second nitride layer, layer of mixture of an Au alloy and the same nitride as that constituting the second nitride layer and Au alloy layer are provided to thereby constitute a hardening layer of multilayer structure, the thickness of the Au alloy layer can be reduced as compared with that of a multilayer laminate structure obtained by repeated alternate lamination of nitride layers of HfN, TiN, ZrN, etc. and Au alloy layers finalized with an Au alloy layer as an outermost layer. Accordingly, the amount of Au used can be strikingly reduced to thereby permit cutback of decorative part production cost. This is also a significant feature of the first invention.

In the golden decorative part according to the second invention, when the golden outermost coating is provided with a thickness of 0.005 to 0.04 μm, any blemish occurring in the golden outermost coating itself becomes shallow, thereby suppressing the visibility of the blemish to the naked eye. Further, as the thickness is extremely small, with respect to incident light, the light having been reflected by the golden outermost coating and the light having passed through the golden outermost coating and reflected by the golden hard coating would be simultaneously perceived. Accordingly, the color tone of appearance exhibited by the golden decorative part according to the second invention would be a color tone resulting from reflection of the color tone of the golden hard coating on the golden color tone of the outermost coating. Thus, a bright luxurious golden color tone never realized by the outermost coating only can be exhibited.

Therefore, the golden decorative part according to the second invention, even when the outermost layer coating is marred, would suppress the visibility of blemish to the naked eye, and simultaneously would exhibit a bright luxurious golden color tone, thereby ensuring retention of the beauty of decorative piece over a prolonged period of time.

BRIEF DESCRIPTION OF THE DRAWINGS

FIG. 1 is a sectional schematic view showing the hardening layer structure of a decorative part as one exemplary form of the decorative part of the invention; and FIG. 2 shows reflectance spectra for the golden decorative pieces obtained in Example 2-1 and Example 2-4 of the invention compared with the reflectance spectra for Swiss gold plating color standards (1N-14 color), a hafnium nitride (HfN) substrate and a titanium nitride (TiN) substrate.

BEST MODE FOR CARRYING OUT THE INVENTION

The decorative part of the first invention will be described.

With reference to FIG. 1., a base consists of a base material 2, such as a stainless material, Ti, a Ti alloy or brass which is machined into a desired configuration in the form of any of various decorative parts. Subsequently, an undercoat layer 8 is provided thereon. Specifically, a metal layer of Hf, Ti or Zr is formed in an arbitrary inert gas plasma. Further, in a gas plasma atmosphere consisting of an arbitrary inert gas mixed with a nitrogen component, there are formed a first nitride layer 4 consisting of a nitride of the same metal as that constituting the metal layer, such as HfN, TiN or ZrN, and a second nitride layer 6 of, for example, HfN, TiN or ZrN differing from the first nitride layer superimposed on the first nitride layer. Thereafter, a top layer 14 is formed on the undercoat layer. Specifically, in a gas plasma atmosphere consisting of an arbitrary inert gas mixed with a nitrogen component, a mixture layer 10 defined by the mixture of an Au alloy and the same nitride as that constituting the second nitride layer 6, such as HfN, TiN or ZrN, is formed on the undercoat layer 8 and an Au alloy layer 12 is formed on the mixture layer 10. Thus, a hardening layer of multilayer structure is realized. By the employment of a technique through this process, there can be obtained a decorative part that is free from marring by impact and has a high hardness and a high corrosion resistance capable of preventing any corrosion. The particulars of the first invention will be set forth in the following Examples.

Now, the golden decorative part of the second invention and the process for producing the same will be described in detail.

[Golden Decorative Part]

The golden decorative part of the second invention is composed of a base material for decorative piece, a golden hard coating and a golden outermost coating. The golden decorative part of the second invention may have a second hard coating interposed between the base material for decorative piece and the golden hard coating. Further, the golden decorative part of the second invention may have an undercoat layer interposed between the base material for decorative piece and the second hard coating.

Each of the layers of these monolayer, bilayer and triple-layer structures is generally produced by a dry plating method. As the dry plating method, in particular, there can be mentioned, for example, a physical vapor deposition method (PVD) such as a sputtering method, an arc method, an ion plating method or an ion beam method, and a chemical vapor deposition method (CVD). Among these, especially preferred use is made of a sputtering method, an arc method and an ion plating method.

As the process for producing a golden decorative part according to the second invention, there is provided a process for producing a golden decorative part furnished as a golden outermost coating with a coating of gold (Au) or a gold alloy exhibiting a golden color tone by the use of a dry plating method. The process is characterized by including the step of producing a base material for decorative piece from a metal or ceramic material by the use of various machining means and the step of forming a golden hard coating on a surface of the base material by the use of a dry plating method and further forming a golden outermost coating of gold (Au) or gold alloy on the surface of the golden hard coating by the use of a dry plating method, so that the golden hard coating contains as a major component either a metal nitride consisting of chromium nitride (CrN), zirconium nitride (ZrN), hafnium nitride (HfN), vanadium nitride (VN), niobium nitride (NbN), tantalum nitride (TaN), etc, or a metal carbonitride consisting of chromium carbonitride, zirconium carbonitride, hafnium carbonitride, vanadium carbonitride, niobium carbonitride, tantalum carbonitride, etc.

In this process, the golden outermost coating has a thickness of 0.005 to 0.04 μm, preferably 0.02 to 0.04 μm and still preferably 0.02 to 0.03 μm.

In the process, preferably, a second hard coating is formed between the base material for decorative piece and the golden hard coating by the use of a dry plating method, which second hard coating contains as a major component a metal nitride consisting of titanium nitride (TiN), chromium nitride (CrN), zirconium nitride (ZrN), hafnium nitride (HfN), vanadium nitride (VN), niobium nitride (NbN), tantalum nitride (TaN), etc., or a metal carbide consisting of titanium carbide (TiC), chromium carbide ($Cr_3C_2$), zirconium carbide (ZrC), hafnium carbide (HfC), vanadium carbide (VC), niobium carbide (NbC), tantalum carbide (TaC), etc., or a metal carbonitride consisting of titanium carbonitride, chromium carbonitride, zirconium carbonitride, hafnium carbonitride, vanadium carbonitride, niobium carbonitride, tantalum carbonitride, etc.

It is desired that the golden color tone of the golden decorative part according to the second invention range from 1N-14 to 2N-18 in terms of Swiss gold plating color standards. The golden decorative part falling within the above range has a mirror surface glaze and exhibits a gold color tone ranging from $L^*(10.0\text{-}90.0)a^*(6.0)b^*(3.0)$ to $L^*(10.0\text{-}90.0)a^*(1.0)b^*(15.0)$. In the formula, $L^*$, in the CIE 1976 ($L^*a^*b^*$) color space of the International Commission on Illumination (Commission International de l'Eclariage, CIE), represents the brightness index, and $a^*$ and $b^*$ represent chromaticness indexes. The $L^*$, $a^*$ and $b^*$ of the gold color tone are measured on a test specimen with mirror surface glaze by the use of Spectrophotometer CM503d manufactured by Konica Minolta Holdings, Inc. in accordance with the method of measuring a material color by 0-deg. viewing field XYZ system provided for in the CIE standards.

The golden decorative part of the second invention generally has a surface hardness of 1400 to 2500, preferably 1600 to 2500 and still preferably 1900 to 2500 (HV, measured with a load of 5 mN held for 10 sec. using a hardness meter (Fischer Scope (registered trade name) H100) manufactured by Fisher Technology Inc.). As long as the hardness falls within the above range, the golden decorative part excels in marring resistance.

When the surface hardness is excessively low, marring would unfavorably tend to occur on the surface of the golden decorative part.

When, for example, the thickness of the golden hard coating is increased for an increase of surface hardness, the coating formation would require a prolonged period of time, thereby causing poor productivity. Accordingly, excessively high surface hardness would be unfavorable because coating formation cost would be high beyond necessity.

As the golden decorative part (or personal ornament) of the second invention, there can be mentioned, for example, watch external parts including a watchcase, a watchband, a watch winding stem (winding crown) and a watch caseback, a belt buckle, a finger ring, a necklace, a bracelet, an earring, a pendant, a brooch, a cuff link, a tie clip, a budge, a medal, a spectacle frame, a camera body and a doorknob.

[Golden Outermost Coating]

The golden outermost coating as a constituent of the golden decorative part of the second invention consists of gold (Au) or a gold alloy exhibiting a golden color tone, and is superimposed on the surface of the golden hard coating by a dry plating method.

It is desired to select gold and an element with whole-proportion solid solubility therein in the gold alloy for use in the golden outermost coating. The thus obtained gold alloy would give a dense coating even in the form of a thin film, thereby realizing excellence in corrosion resistance, suppression of any occurrence of discoloration, etc. and attainment of high reliability.

As the above gold alloy, there can be mentioned a gold-nickel (Au—Ni) alloy, a gold-palladium (Au—Pd) alloy, a gold-platinum (Au—Pt) alloy or a gold-rhodium (Au—Rh) alloy. This gold alloy upon reflection of the color tone of the golden hard coating would exhibit a bright luxurious golden color tone for the golden decorative part. These gold alloy examples can be used individually or in combination.

It is preferred to employ a gold-nickel (Au—Ni) alloy that would realize a color tone close to that of pure gold as the golden outermost coating.

Desirably, the thickness of the golden outermost coating is in the range of 0.005 to 0.04 μm. The golden outermost coating consisting of gold or a gold alloy, due to its low hardness likely to invite marring, is likely to spoil the beauty of golden decorative part. However, by regulating the thickness of the golden outermost coating at 0.04 μm or less, any blemish generated in the golden outermost coating itself is a shallow one incapable of reaching a depth exceeding 0.04 μm, thereby suppressing the visibility of blemish to the naked eye. Consequently, spoilage of the beauty of golden decorative part can be avoided.

When the golden outermost coating is as thin as 0.04 μm or less, as the color tone of the golden hard coating is intensely reflected, there can be realized a bright luxurious golden color tone never attained by the color tone of the golden outermost coating only.

With respect to a coating of less than 0.005 μm, the formation thereof as a film is difficult.

When the thickness of the golden outermost coating is in the range of 0.02 to 0.04 μm, preferably, not only can the visibility of blemish be suppressed but also a satisfactorily reliable corrosion resistance can be attained. When the thickness is in the range of 0.02 to 0.03 μm, still preferably, not only can suppression of the visibility of blemish and attainment of satisfactory corrosion resistance be realized but also enhancements of coloration (brightness) and abrasion resistance can be achieved.

As the dry plating method, use can be made of a sputtering method, a vacuum vapor deposition method or an ion plating method.

Now, the formation of the individual coatings of the golden decorative part according to the second invention, especially the formation of the golden outermost coating by a sputtering method will be described in greater detail.

The base material for watchband or the like is preferably washed with an organic solvent or the like in advance. The interior of a sputtering apparatus is evacuated to $1.0 \times 10^{-5}$ to $1.0 \times 10^{-2}$ Pa, preferably $1.0 \times 10^{-5}$ to $1.0 \times 10^{-3}$ Pa, and an atmosphere gas is introduced therein to $1.0 \times 10^{-2}$ to $5.0 \times 10^{-1}$ Pa, preferably $5.0 \times 10^{-2}$ to $1.0 \times 10^{-1}$ Pa.

For obtaining an outermost layer coating with homogeneous gold color tone, lowering of the pressure within the apparatus before coating formation is advantageous. It is desirable to evacuate the apparatus to $1.0 \ 10^{-3}$ Pa or below, preferably $1.0 \ 10^{-4}$ Pa or below. The reason is that, in accordance with lowering of the pressure within the apparatus, the amount of unavoidable components present within the apparatus is reduced to thereby homogenize the golden color tone.

[Golden Hard Coating]

The golden hard coating as a constituent of the golden decorative part of the second invention is formed between the base material for decorative piece and the golden outermost coating or between the second hard coating and the golden outermost coating by a dry plating method.

The golden hard coating is desired to have higher hardness and greater marring resistance than those of the golden outermost coating. The ratio of the surface hardness (HV, measured with a load of 5 mN held for 10 sec. using a hardness meter (Fischer Scope (registered trade name) H100) manufactured by Fisher Technology Inc.) of the golden hard coating to that of the golden outermost coating is generally 1800, preferably 2000 and still preferably 2300.

It is desired that the golden hard coating be constituted of either a metal nitride consisting of chromium nitride (CrN), zirconium nitride (ZrN), hafnium nitride (HfN), vanadium nitride (VN), niobium nitride (NbN), tantalum nitride (TaN), etc. or a metal carbonitride consisting of chromium carbonitride, zirconium carbonitride, hafnium carbonitride, vanadium carbonitride, niobium carbonitride, tantalum carbonitride, etc. These metal nitrides and metal carbonitrides can be used either individually or in combination as long as at least one thereof is contained as a major component (component contained in a proportion of 50 to 100 at % in the golden hard coating).

The appearance of the golden decorative part would exhibit a bright luxurious golden color tone by virtue of reflection of the golden color tone of the golden hard coating on the color tone of the golden outermost coating.

The golden hard coating preferably consists of zirconium nitride (ZrN) or hafnium nitride (HfN) which would have a hardness higher than that of the golden outermost coating and exhibit a bright faintly-yellow color tone (lemon-yellow color tone). The use of these metal nitrides as the golden hard coating would realize enhancements of exhibition of a bright luxurious golden color tone in the appearance of the golden decorative part and suppression of any blemish to the naked eye. It is more preferred to use hafnium nitride (HfN) as the golden hard coating from the viewpoint that in addition to brightness and premium accents, the appearance of the golden decorative part would be given a warm golden color tone.

Even if the golden outermost coating partially wears away, at the worn part, the golden hard coating with a golden color tone similar to that of the golden outermost coating is exposed so that the wearing of the golden outermost coating is inconspicuous. Accordingly, there can be provided a decorative part capable of retaining its beauty over a prolonged period of time.

Changing of the ratio of elements contained in the above metal nitride or metal carbonitride would enable easily controlling of the color tone, for example, the light-dark of the golden color tone of the golden hard coating, so that the color tone of the appearance of the golden decorative part can be freely altered.

The golden hard coating has a thickness of 0.6 to 1.0 μm, preferably 0.7 to 1.0 μm and still preferably 0.9 to 1.0 μm.

When the thickness of the golden hard coating is excessively small, the surface hardness of the golden decorative part would be unfavorably low to thereby diminish the marring resistance of the surface of the golden decorative part.

However, when the golden decorative part has not only the golden hard coating but also the second hard coating described later, the golden hard coating would cooperate with the second hard coating to retain the surface hardness of the golden decorative part, thereby highly practically permit reduction of the thickness of the golden hard coating. In that instance, the golden hard coating has a thickness of generally 0.1 to 0.3 μm, preferably 0.15 to 0.25 μm and still preferably 0.18 to 0.22 μm.

When the thickness of the golden hard coating is excessively small, the color tone of either the material lying under the golden hard coating or the coating lying under the golden hard coating would be reflected on the color tone of the golden hard coating, thereby causing the risk of viewing of any altered color tone of the golden hard coating. That is, when the thickness of the golden hard coating is excessively small, for example, either the color tone of the surface of the base material for decorative piece lying under the golden hard coating or the color tone of the surface of the second hard coating described later might dull the bright faintly-yellow color tone of the golden hard coating. Consequently, unfavorably, the golden decorative part of the second invention would not have an appearance with a bright luxurious golden color tone.

On the other hand, when the thickness of the golden hard coating is excessively large, the coating formation would require a prolonged period of time, thereby causing poor productivity. Accordingly, unfavorably, the coating formation cost would be high beyond necessity.

In particular, when zirconium nitride (ZrN) or hafnium nitride (HfN) is employed as the golden hard coating in order for the golden hard coating to exhibit a bright faintly-yellow color tone (lemon-yellow color tone), as zirconium and hafnium materials are expensive, excessively large thickness of the golden hard coating would invite a grave economic disadvantage.

As the dry plating method, in particular, there can be mentioned, for example, a physical vapor deposition method (PVD), such as a sputtering method, an arc method, an ion plating method or an ion beam method, and a chemical vapor deposition method (CVD). Among these, especially preferred use is made of a sputtering method, an arc method and an ion plating method.

<With Respect to Golden Outermost Coating and Golden Hard Coating>

The color tone of appearance of the golden decorative part according to the second invention results from simultaneous perception of, out of incident light, the light having been reflected by the golden outermost coating and the light having passed through the golden outermost coating and reflected by the golden hard coating.

Accordingly, the color tone of appearance exhibited by the golden decorative part according to the second invention would be the color tone resulting from reflection of the color tone of the golden hard coating on the golden color tone of the outermost coating. Thus, a bright luxurious golden color tone never realized by the outermost coating only can be exhibited.

In the combination of the golden outermost coating with the golden hard coating, preferably, a gold-nickel (Au—Ni) alloy, a gold-palladium (Au—Pd) alloy, a gold-platinum (Au—Pt) alloy or a gold-rhodium (Au—Rh) alloy is used in the golden outermost coating, while zirconium nitride (ZrN) or hafnium nitride (HfN) is used in the golden hard coating. The reason is that there can be obtained a golden decorative part enhanced in the bright luxurious golden color tone and in the suppression of the visibility of blemish to the naked eye.

It is more preferred to use a gold-nickel (Au—Ni) alloy in the golden outermost coating and use hafnium nitride (HfN) in the golden hard coating. The reason is that in addition to brightness, premium accents and blemish invisibility, a warm color tone can be exhibited and the appearance of the golden decorative part can be given the 1N-14 golden color tone as defined in Swiss gold plating color standards.

When the thickness of the golden outermost coating is 0.2 μm or less, the color tone of the golden hard coating can be reflected. However, with a thickness exceeding 0.2 μm, reflection of the color tone of the golden hard coating might be suppressed to thereby render attainment of a warm luxurious golden color tone difficult.

In that instance, the golden outermost coating has a thickness of generally 0.005 to 0.04 μm, preferably 0.02 to less than 0.04 μm and still preferably 0.02 to 0.03 μm, and the golden hard coating has a thickness of generally 0.6 to 1.0 μm, preferably 0.7 to 1.0 µm and still preferably 0.9 to 1.0 µm. When the golden decorative part has the second hard coating described later together with the golden hard coating, the golden outermost coating has a thickness of generally 0.005 to 0.04 µm, preferably 0.02 to less than 0.04 µm and still preferably 0.02 to 0.03 µm, and the golden hard coating has a thickness of generally 0.1 to 0.3 µm, preferably 0.15 to 0.25 µm and still preferably 0.18 to 0.22 µm, and the second hard coating has a thickness of 0.6 to 1.0 µm, preferably 0.7 to 1.0 µm and still preferably 0.9 to 1.0 µm.

When a gold-nickel (Au—Ni) alloy is employed in the golden outermost coating, the content of Au atoms in the golden outermost coating is preferably in the range of 70 to 90 at %, still preferably 75 to 85 at %. The content of Ni atoms in the outermost coating is preferably in the range of 10 to 30 at %, still preferably 15 to 25 at %. The golden outermost coating containing Au and Ni in these atom contents upon reflection of the color tone of the golden hard coating would exhibit a bright luxurious golden color tone.

When the gold-nickel (Au—Ni) alloy is employed in the golden outermost coating and hafnium nitride (HfN) employed in the golden hard coating, preferably, the content of hafnium (Hf) atoms in the golden hard coating is at least equivalent to stoichiometric composition, or more than the stoichiometric composition. This golden hard coating upon reflection of the color tone thereof on the golden outermost coating would impart a golden color tone exhibiting brightness, premium accents and warmness to the appearance of the golden decorative part. In particular, the content of hafnium (Hf) atoms in the golden hard coating is preferably in the range of 50 to 70 at %, still preferably 55 to 65 at %.

The content of nitrogen (N) atoms in the golden hard coating is preferably in the range of 30 to 50 at %, still preferably 35 to 45 at %.

In the measurement of atoms and contents thereof in the golden outermost coating and golden hard coating, actually, unavoidable components amounting to about 1 to 5 at % are often measured. Herein, the unavoidable components mean, for example, the components, such as oxygen and carbon, unavoidably remaining in the chamber of a dry plating apparatus. In particular, in the portion of the golden outermost coating close to the surface layer, occasionally, unavoidable components are trapped in an amount of about 5 at %. In that instance, the content of Au atoms in the portion of the golden outermost coating close to the surface layer is measured less by several atomic percents.

<With Respect to Two-Tone Processing>

The two-tone processing for parallel arrangement of the golden outermost coating and a non-golden heterochromatic outermost layer coating is attained by, for example, the following method. First, an undercoat layer is formed on a surface of base material for decorative piece. A second hard coating is formed on the surface of the undercoat layer. A golden hard coating is formed on the surface of the second hard coating. A golden outermost coating is formed on the surface of the golden hard coating, thereby providing a decorative part. Subsequently, masking treatment is carried out so that the surface of the golden outermost coating at its portion is provided with a mask coating. Then, by a dry plating method or wet plating method, a non-golden heterochromatic outermost layer coating of, for example, silver, stainless, platinum, pink or black color tone is formed on the mask and the unmasked surface of the golden outermost coating. Thereafter, the operation of removing the mask and the heterochromatic outermost layer coating on the mask is carried out at least once. As a result, the appearance involving parallel arrangement of the golden outermost coating and the non-golden heterochromatic outermost layer coating is provided on the decorative part.

[Second Hard Coating]

The second hard coating as a constituent of the golden decorative part of the second invention is provided between the undercoat layer and the golden hard coating, or between the base material for decorative piece and the golden hard coating.

When the hardness of the second hard coating is higher than that of the golden hard coating, the hardness of the whole coating laminate is strikingly enhanced. The second hard coating functions as a hardness imparting coating for sustaining or determining the hardness of the whole coating laminate of the golden decorative part. That is, when the second hard coating is provided, the hardness of the whole coating laminate as a constituent of the golden decorative part can be enhanced. The ratio of the surface hardness (HV, measured with a load of 5 mN held for 10 sec. using a hardness meter (Fischer Scope (registered trade name) H100) manufactured by Fisher Technology Inc.) of the second hard coating to that of the golden hard coating is generally 1600, preferably 1800 and still preferably 2000.

The second hard coating consists of a metal compound coating formed on the surface of undercoat layer or surface of base material for decorative piece by a dry plating method. It is desired that the metal compound coating be constituted of a metal nitride consisting of titanium nitride (TiN), chromium nitride (CrN), zirconium nitride (ZrN), hafnium nitride (HfN), vanadium nitride (VN), niobium nitride (NbN), tantalum nitride (TaN), etc., or a metal carbide consisting of titanium carbide (TiC), chromium carbide ($Cr_3C_2$), zirconium carbide (ZrC), hafnium carbide (HfC), vanadium carbide (VC), niobium carbide (NbC), tantalum carbide (TaC), etc., or a metal carbonitride consisting of titanium carbonitride, chromium carbonitride, zirconium carbonitride, hafnium carbonitride, vanadium carbonitride, niobium carbonitride, tantalum carbonitride, etc. These metal compounds for use in the second hard coating can be used individually or in combination.

As the dry plating method, in particular, there can be mentioned, for example, a physical vapor deposition method (PVD), such as a sputtering method, an arc method, an ion plating method or an ion beam method, and a chemical vapor deposition method (CVD). Among these, especially preferred use is made of a sputtering method, an arc method and an ion plating method.

The thickness and composition of the second hard coating are determined in the light of the hardness, adhesion, productivity, etc. of the whole coating laminate.

When the thickness of the second hard coating is larger than that of the hard coating, the hardness of the whole coating laminate is enhanced. The thickness of the second hard coating is in the range of 0.6 to 1.0 µm, preferably 0.7 to 1.0 µm and still preferably 0.9 to 1.0 µm.

When the thickness of the second hard coating is excessively small, the hardness of the second hard coating per se would be low. Accordingly, the hardness of the whole coating laminate including the golden outermost coating, golden hard coating and second hard coating would be low. Consequently, excessively small thickness of the second hard coating is unfavorable as the marring resistance of the golden decorative part would become poor.

On the other hand, when the thickness of the second hard coating is excessively large, the coating formation would require a prolonged period of time, thereby causing poor productivity. Accordingly, unfavorably, the coating formation cost would be high beyond necessity.

In the use of the second hard coating of golden color tone, even if the golden hard coating partially wears away, the golden color tone of the second hard coating as an underlayer thereof is exposed, so that there can be provided a golden decorative part capable of retaining its beauty over a prolonged period of time. Preferably, zirconium nitride (ZrN) or hafnium nitride (HfN) is used in the golden hard coating with golden color tone, while titanium nitride (TiN) with a dark yellow color tone or hafnium nitride (HfN) with a golden color tone is used in the second hard coating.

It is more preferred to use hafnium nitride (HfN) in the golden hard coating in combination with the use of titanium nitride (TiN) or hafnium nitride (HfN) in the second hard coating as in addition to brightness and premium accents the appearance of the golden decorative part would be given a warm golden color tone. The employment of titanium nitride (TiN) in the second hard coating is especially preferred from the viewpoint that in addition to the above advantages of color tone, titanium nitride is inexpensive to thereby bring about economic effects. In the employment of hafnium nitride (HfN) in the second hard coating, in addition to the above advantages of golden color tone, the hardness of hafnium nitride is so high that even when being thin, the whole coating laminate can have a satisfactory hardness.

[Undercoat Layer]

The undercoat layer as a constituent of the golden decorative part of the second invention consists of at least one plated coating formed by a wet plating method and/or dry plating method.

The undercoat layer is provided between the base material for decorative piece and the second hard coating. The undercoat layer functions as a layer capable of enhancing the adhesion of the whole coating laminate of the golden decorative part.

When the base material for decorative piece consists of a metal other than copper and copper alloy, or a ceramic, the undercoat layer provided on the surface of the base material desirably consists of a metal coating, formed by a dry plating method, containing as a major component (component contained in a proportion of 50 to 100 at % in the undercoat layer) an element selected from among titanium (Ti), chromium (Cr), zirconium (Zr), hafnium (Hf), vanadium (V), niobium (Nb) and tantalum (Ta), the element being the same as that contained in the second hard coating. This metal coating can enhance the adhesion of the whole coating laminate of the golden decorative part. These metal coatings for use in the undercoat layer can be used individually or in combination.

When the undercoat layer on its surface is provided with the second hard coating of a metal carbide consisting of titanium carbide (TiC), chromium carbide ($Cr_3C_2$), zirconium carbide (ZrC), hafnium carbide (HfC), vanadium carbide (VC), niobium carbide (NbC), tantalum carbide (TaC), etc., or a metal nitride consisting of titanium nitride (TiN), chromium nitride (CrN), zirconium nitride (ZrN), hafnium nitride (HfN), vanadium nitride (VN), niobium nitride (NbN), tantalum nitride (TaN), etc., or a metal carbonitride consisting of titanium carbonitride, chromium carbonitride, zirconium carbonitride, hafnium carbonitride, vanadium carbonitride, niobium carbonitride, tantalum carbonitride, etc., there can be enhanced the adhesion between the base material for decorative piece and the second hard coating. These metal compounds for use in the second hard coating can be used individually or in combination.

With respect to the combination of undercoat layer (metal coating) and second hard coating, there can be mentioned, for example, titanium (undercoat layer)-titanium nitride (second hard coating), zirconium (undercoat layer)-zirconium nitride (second hard coating) and hafnium (undercoat layer)-hafnium nitride (second hard coating). In the employment of titanium (undercoat layer)-titanium nitride (second hard coating), especially preferably, even when the golden hard coating wears away, the dark yellow color tone of titanium nitride lying as its underlayer would surface to thereby lower the discern ability of worn site, and there can be enhanced the adhesion of the whole coating laminate of the golden decorative part and also the adhesion between the base material for decorative piece and the second hard coating.

From the viewpoint of highly enhanced adhesion between the base material for decorative piece and the second hard coating, it is preferred that the undercoat layer consist of, formed by a dry plating method, a metal carbide of titanium carbide, chromium carbide, zirconium carbide, hafnium carbide, vanadium carbide, niobium carbide or tantalum carbide whose carbon atom content is in the range of 5 to 15 at %. In the metal carbide, the carbon atom content of the metal compound gradually decreases in accordance with approaching to the surface of the base material for decorative piece. Thus, the metal carbide is called a gradient coating.

The thickness of the undercoat layer (metal coating or metal compound coating) is in the range of 0.1 to 0.3 µm, preferably 0.15 to 0.25 µm and still preferably 0.18 to 0.22 µm. When the thickness of the coating is excessively small, unfavorably, the adhesion with the base material would be low. On the other hand, when the thickness is excessively large, the coating formation cost would be high, thereby being unfavorable from the economic point of view. Increasing of the thickness of metal compound coating (undercoat layer) over the above range would have no significance because the adhesion with the base material would no longer be enhanced.

As the dry plating method, in particular, there can be mentioned, for example, a physical vapor deposition method (PVD), such as a sputtering method, an arc method, an ion plating method or an ion beam method, and a chemical vapor deposition method (CVD). Among these, especially preferred use is made of a sputtering method, an arc method and an ion plating method.

In the golden decorative part of the second invention, when the base material for decorative piece consists of copper or a copper alloy, the undercoat layer is preferably composed of a nickel coating of 1 to 10 µm, preferably 1 to 5 µm thickness formed on the surface of the base material by a wet plating method and an amorphous nickel-phosphorus alloy coating of 3 to 10 µm, preferably 3 to 5 µm thickness formed on the surface of the nickel coating by a wet plating method.

From the viewpoint of prevention of nickel allergy, when the base material for decorative piece consists of copper or a copper alloy, it is preferred that the undercoat layer be, formed by a wet plating method, a coating of 2 to 9, especially 2 to 3 µm thickness constituted of at least one member selected from the group consisting of copper, palladium, a copper-tin alloy, a copper-tin-zinc alloy and a copper-tin-palladium alloy.

[Base Material for Decorative Piece]

The base material for decorative piece for use in the golden decorative part of the second invention consists of a metal or ceramic.

As the metal (including an alloy), there can be mentioned, for example, stainless steel, titanium, a titanium alloy, copper, a copper alloy and tungsten carbide. These metals can be used individually or in combination.

As the ceramic, there can be mentioned, for example, a zirconia ceramic or the like. The zirconia ceramic in its composition is a stabilized zirconia containing 3 to 7 wt. % of yttrium oxide ($Y_2O_3$) or another stabilizer (for example, magnesium oxide (MgO) or calcium oxide (CaO)) and exhibits a white color tone. More particularly, the zirconia ceramic is composed mainly of zirconia and a binder wherein 20 to 25 parts by weight of binder is contained per 100 parts by weight of stabilized zirconia powder containing 3 to 7 wt. % of stabilizer, such as yttrium oxide. After firing, the zirconia ceramic exhibits a white color tone. The binder preferably consists of, for example, a mixture of at least two members selected from the group consisting of polyethylene, polypropylene, polystyrene, ethylene vinyl acetate, butyl methacrylate, polyacetal, wax and stearic acid.

In the second invention, the reason for selection of the zirconia ceramic containing 3 to 7 wt. % of stabilizer, such as yttrium oxide (yttria), is as follows. When the amount of stabilizer, such as yttria, is less than 3 wt. %, the molded zirconia ceramic would have low impact resistance (becoming brittle), thereby being likely to suffer cracking, etc. by impact from outside. The use of stabilizer in an amount of more than 7 wt. % would also bring about lowering of impact resistance, thereby being likely to suffer cracking, etc. by impact from outside. It is presumed that when the amount of stabilizer falls within the above range, the crystal structure of zirconia ceramic would be a two-phase mixed structure composed of cubical crystal and monoclinic crystal so that the impact resistance can be stabilized.

The reason for regulation of the binder content to 20 to 25 parts by weight per 100 parts by weight of zirconia powder is as follows. When the amount of binder is less than 20 parts by weight, injection moldability would be deteriorated and complete material filling in the metal mold would be difficult. On the other hand, when the amount is more than 25 parts by weight, degreasing operation would be time-consuming to thereby deteriorate mass productivity, and the configuration obtained by molding would be likely to break up.

The base material for decorative piece consisting of a metal is fabricated from the above-mentioned metal by the use of conventional machinings. According to necessity, the base material for decorative piece is provided by various means with at least one surface finishing selected from among mirror surface finishing, pearskin finishing, hairline finishing, honing finishing, stamping finishing and etching finishing. The base material for decorative piece, for example, base material for watchcase consisting of a ceramic is produced by carrying out injection molding of a material composed mainly of zirconia and a binder into a watchcase-shaped item, subsequently roughly machining the shaped item by the use of mechanical means, degreasing and firing the roughly machined shaped item to thereby obtain a crude base material for watchcase, and machining, for example, grinding and polishing the crude base material.

In the second invention, it is preferred to wash and degrease the surface of the base material for decorative piece with the use of conventional organic solvents, etc. in advance of forming of the undercoat layer on the surface of the base material for decorative piece.

EXAMPLE

Now, the first invention and the second invention will be described with reference to Examples, which however in no way limit the scope of the inventions.

Examples of the first invention will be described.

First Embodiment

In the first embodiment of the first invention, the following technique of forming a hardening layer of multilayer structure was employed. In an Ar/nitrogen mixed gas plasma atmosphere, a first nitride layer consisting of an HfN layer, TiN layer or ZrN layer and a second nitride layer consisting of an HfN layer, TiN layer or ZrN layer that differed from the first nitride layer were formed to thereby provide an undercoat layer. Subsequently, in an Ar/nitrogen mixed gas plasma atmosphere, a layer of mixture of Au alloy and HfN layer, TiN layer or ZrN layer and an Au alloy layer were formed to thereby provide a top layer on the undercoat layer. Thus, the hardening layer was realized.

Example 1-1

Referring to the drawing, the first embodiment of the first invention will be described.

FIG. 1 is a sectional schematic view showing a hardening layer structure for arbitrary base material 2. The arbitrary base material 2 was disposed in a vacuum apparatus, and the interior of the vacuum apparatus was evacuated to vacuum. Thereafter, Ar and nitrogen were introduced, and an Ar/nitrogen mixed gas plasma was generated. In an atmosphere of mixed gas plasma maintained at a pressure of 0.2 Pa, using Zr, a ZrN layer as the first nitride layer 4 was formed on the surface of the arbitrary base material 2 according to a DC sputtering method. Likewise, an HfN layer differing from the first nitride layer 4 was formed as the second nitride layer 6, thereby providing the undercoat layer 8. Further in the same gas plasma atmosphere of the same pressure, using Hf and an Au alloy, the mixture layer 10 defined by the mixture of Au alloy and HfN being the same nitride as that constituting the second nitride layer 6 and the Au alloy layer 12 were formed on the undercoat layer 8 according to a DC sputtering method, thereby providing the top layer 14. The coating formation was carried out while regulating the coating formation time so that the thicknesses as set values are 0.7 μm with respect to the ZrN layer being the first nitride layer 4 and 0.1 μm with respect to the HfN layer being the second nitride layer 6 as constituents of the undercoat layer 8, and so that the thicknesses are 0.02 μm (20 nm) with respect to the mixture layer 10 defined by the mixture of Au alloy and HfN being the same nitride as that constituting the second nitride layer 6 and 0.02 μm with respect to the Au alloy layer 12 as constituents of the top layer 14, thereby realizing a total thickness of 0.84 μm. A watchcase of material SUS304 was used as the arbitrary base material 2. An Au—Ni alloy of arbitrary composition was used in the mixture layer 10 and Au alloy as layer 12.

Examples 1-2 to 1-16

In the same manner as in Example 1-1, the interior of a vacuum apparatus was evacuated to vacuum, and Ar and nitrogen were introduced. An Ar/nitrogen mixed gas plasma was generated, and in an atmosphere of mixed gas plasma maintained at a pressure of 0.2 Pa, using Hf, Ti or Zr, an HfN, TiN or ZrN layer as a first nitride layer 4 was formed on the surface of an arbitrary base material 2 according to a DC sputtering method. Likewise, an HfN, TiN or ZrN layer differing from the first nitride layer 4 was formed as a second nitride layer 6, thereby providing an undercoat layer 8. Further in the same gas plasma atmosphere of the same pressure, using Hf, Ti or Zr and an Au alloy, a layer 10 of mixture of Au alloy and HfN, TiN or ZrN being the same nitride as that constituting the second nitride layer 6 and an Au alloy layer 12 were formed on the undercoat layer 8 according to a DC sputtering method, thereby providing a top layer 14. The coating formation was carried out while regulating the coating formation time so that the thicknesses as set values are 0.7

μm with respect to the HfN, TiN or ZrN layer being the first nitride layer 4 and 0.1 to 0.2 μm with respect to the HfN, TiN or ZrN layer being the second nitride layer 6 as constituents of the undercoat layer 8, and so that the thicknesses are 0.02 to 0.04 μm with respect to the layer 10 of mixture of Au alloy and HfN, TiN or ZrN being the same nitride as that constituting the second nitride layer and 0.02 μm with respect to the Au alloy layer 12 as constituents of the top layer 14, thereby realizing a total thickness of 0.84 to 0.96 μm. A watchcase, watchband and watch bezel of materials Ti, Ti alloy, SUS304 and SUS316L were used as the arbitrary base material 2. An Au—Ni alloy of arbitrary composition was used in the Au alloy layer.

Comparative Examples 1-1 to 1-16

In Comparative Examples 1-1 to 1-16 relevant to one embodiment of the first invention, an Au—Ni coating and Au—Pd coating were formed by a wet plating method on the surface of watch external parts, such as a watchcase, a watchband and a watch bezel, being decorative parts of materials Ti, Ti alloy, SUS304 and SUS316L while conducting time regulation so that the thickness as a set value was 0.95 μm.

Table 1-1 and Table 1-2 summarize the results of hardness test, abrasion resistance test and corrosion resistance test together with comprehensive evaluation results with respect to the watch external parts produced in Examples 1-1 to 1-16 according to the first embodiment of the first invention and relevant Comparative Examples 1-1 to 1-16.

The compositions of, constituted using, for example, an HfN layer, TiN layer or ZrN layer, the first nitride layer and second nitride layer and nitride/Au alloy mixture layer and the Au alloy layer were identified by EPMA analysis (X-ray microanalysis). The hardness thereof was measured by means of a micro-Vickers hardness meter under a load of 5 mN, and when the Vickers hardness (Hv) was 1500 or higher, acceptance was judged. In the abrasion resistance test, an abrasion test was performed by the use of abrasion tester NUS-ISO-2 manufactured by Suga Test Instruments Co., Ltd., and when in the analysis of test subject surface after testing by EPMA, there was no exposure of underlying base material surface, acceptance was judged. In the corrosion resistance test, a specimen was immersed in a CASS test solution for 48 hours, and when no corrosion occurred at all, acceptance was judged. When acceptance was judged in all of these tests, acceptance in comprehensive evaluation result was judged.

The method of abrasion test using abrasion tester NUS-ISO-2 manufactured by Suga Test Instruments Co., Ltd. will be described in detail. Nitride layers and Au alloy layers are alternately formed on a flat-plate test specimen of the same base material as that of a decorative part in repeating fashion, thereby providing a hardening layer. The test specimen with the hardening layer surface downward is fixed to an opening site of test specimen mounting platform by means of a test specimen presser plate and a test specimen presser screw. Subsequently, a polishing paper is fitted to an abrasion wheel. An upward load such that the polishing paper is pressed against the test specimen by balance means is applied to the abrasion wheel. Thereafter, the test specimen mounting platform is reciprocated by means for converting the rotary motion of a motor to reciprocating motion, and the abrasion wheel is rotated by an angle of 0.9° upon every reciprocation of the test specimen mounting platform. By this rotation, the test specimen at all times is in contact with an unworn new area of the polishing paper fitted to the abrasion wheel The number of reciprocations of the test specimen mounting platform can be automatically set, and the abrasion tester is stopped when the set number of reciprocations is reached. As the polishing paper fitted to the abrasion wheel, use was made of lapping film (#1200, film surface provided with alumina grains of about 12 μm grain diameter). The contact load applied between the test specimen and the polishing paper was 100 gf. The number of reciprocations of the test specimen mounting platform was 50.

TABLE 1-1

|  | Type of base mat'l | Form of decorative part | Undercoat layer | | | | Top layer | | |
|---|---|---|---|---|---|---|---|---|---|
|  |  |  | Mat'l of $1^{st}$ nitride layer | Thickness of $1^{st}$ nitride layer(μm) | Mat'l of $2^{nd}$ nitride layer | Thickness of $2^{nd}$ nitride layer(μm) | Thickness of mixture layer (μm) | Mat'l of Au alloy layer | Thickness of Au alloy layer(μm) |
| Example 1-1 | SUS304 | Watchcase | ZrN | 0.7 | HfN | 0.1 | 0.02 | Au—Ni | 0.02 |
| Example 1-2 | SUS316L | Watchband | ZrN | 0.7 | HfN | 0.2 | 0.02 | Au—Ni | 0.02 |
| Example 1-3 | Ti alloy | Watch bezel | ZrN | 0.7 | HfN | 0.1 | 0.04 | Au—Ni | 0.02 |
| Example 1-4 | SUS304 | Watchcase | ZrN | 0.7 | HfN | 0.2 | 0.04 | Au—Ni | 0.02 |
| Example 1-5 | SUS316L | Watchband | TiN | 0.7 | HfN | 0.1 | 0.02 | Au—Ni | 0.02 |
| Example 1-6 | Ti alloy | Watch bezel | TiN | 0.7 | HfN | 0.2 | 0.02 | Au—Ni | 0.02 |
| Example 1-7 | SUS316L | Watchcase | TiN | 0.7 | HfN | 0.1 | 0.04 | Au—Ni | 0.02 |
| Example 1-8 | SUS316L | Watchband | TiN | 0.7 | HfN | 0.2 | 0.04 | Au—Ni | 0.02 |
| Example 1-9 | SUS304 | Watchcase | HfN | 0.7 | ZrN | 0.1 | 0.02 | Au—Ni | 0.02 |
| Example 1-10 | SUS316L | Watchband | HfN | 0.7 | ZrN | 0.2 | 0.02 | Au—Ni | 0.02 |
| Example 1-11 | Ti alloy | Watch bezel | TiN | 0.7 | ZrN | 0.1 | 0.02 | Au—Ni | 0.02 |
| Example 1-12 | SUS304 | Watchcase | TiN | 0.7 | ZrN | 0.2 | 0.02 | Au—Ni | 0.02 |
| Example 1-13 | SUS316L | Watchband | ZrN | 0.7 | TiN | 0.1 | 0.02 | Au—Ni | 0.02 |
| Example 1-14 | Ti alloy | Watch bezel | ZrN | 0.7 | TiN | 0.2 | 0.02 | Au—Ni | 0.02 |
| Example 1-15 | SUS316L | Watchcase | HfN | 0.7 | TiN | 0.1 | 0.02 | Au—Ni | 0.02 |
| Example 1-16 | SUS316L | Watchband | HfN | 0.7 | TiN | 0.2 | 0.02 | Au—Ni | 0.02 |

TABLE 1-1-continued

|  | Set thickness (μm) | Hardness test Micro hardness (Hv) | Abrasion resist test Exposure of underlying base mat'l | Corrosion resist test Corrosion | Comprehensive rating |
|---|---|---|---|---|---|
| Example 1-1 | 0.84 | 2110 | No | No | Accepted |
| Example 1-2 | 0.94 | 2260 | No | No | Accepted |
| Example 1-3 | 0.86 | 2140 | No | No | Accepted |
| Example 1-4 | 0.96 | 2290 | No | No | Accepted |
| Example 1-5 | 0.84 | 2105 | No | No | Accepted |
| Example 1-6 | 0.94 | 2255 | No | No | Accepted |
| Example 1-7 | 0.85 | 2135 | No | No | Accepted |
| Example 1-8 | 0.96 | 2285 | No | No | Accepted |
| Example 1-9 | 0.84 | 2100 | No | No | Accepted |
| Example 1-10 | 0.94 | 2265 | No | No | Accepted |
| Example 1-11 | 0.84 | 2115 | No | No | Accepted |
| Example 1-12 | 0.94 | 2260 | No | No | Accepted |
| Example 1-13 | 0.84 | 2105 | No | No | Accepted |
| Example 1-14 | 0.94 | 2255 | No | No | Accepted |
| Example 1-15 | 0.84 | 2105 | No | No | Accepted |
| Example 1-16 | 0.94 | 2265 | No | No | Accepted |

TABLE 1-2

|  | Type of base mat'l | Form of decorative part | Mat'l of plating layer | Thickness of plating layer(μm) | Hardness test Micro hardness (Hv) | Abrasion resist test Exposure of underlying base mat'l | Corrosion resist test Corrosion | Comprehensive rating |
|---|---|---|---|---|---|---|---|---|
| Comp. Ex. 1-1 | SUS304 | Watchcase | Au—Ni plating | 0.95 | 670 | Yes | No | Rejected |
| Comp. Ex. 1-2 | SUS316L | Watchband |  | 0.95 | 670 | Yes | No | Rejected |
| Comp. Ex. 1-3 | Ti alloy | Watch bezel |  | 0.95 | 680 | Yes | No | Rejected |
| Comp. Ex. 1-4 | SUS304 | Watchcase |  | 0.95 | 680 | Yes | No | Rejected |
| Comp. Ex. 1-5 | SUS316L | Watchband |  | 0.95 | 660 | Yes | No | Rejected |
| Comp. Ex. 1-6 | Ti alloy | Watch bezel |  | 0.95 | 670 | Yes | No | Rejected |
| Comp. Ex. 1-7 | SUS316L | Watchcase |  | 0.95 | 660 | Yes | No | Rejected |
| Comp. Ex. 1-8 | SUS316L | Watchband |  | 0.95 | 660 | Yes | No | Rejected |
| Comp. Ex. 1-9 | SUS304 | Watchcase | Au—Pd plating | 0.95 | 540 | Yes | No | Rejected |
| Comp. Ex. 1-10 | SUS316L | Watchband |  | 0.95 | 520 | Yes | No | Rejected |
| Comp. Ex. 1-11 | Ti alloy | Watch bezel |  | 0.95 | 500 | Yes | No | Rejected |
| Comp. Ex. 1-12 | SUS304 | Watchcase |  | 0.95 | 520 | Yes | No | Rejected |
| Comp. Ex. 1-13 | SUS316L | Watchband |  | 0.95 | 510 | Yes | No | Rejected |
| Comp. Ex. 1-14 | Ti alloy | Watch bezel |  | 0.95 | 520 | Yes | No | Rejected |
| Comp. Ex. 1-15 | SUS316L | Watchcase |  | 0.95 | 500 | Yes | No | Rejected |
| Comp. Ex. 1-16 | SUS316L | Watchband |  | 0.95 | 510 | Yes | No | Rejected |

Referring to Table 1-1, each of the decorative parts being watch external parts, including a watchcase, a watchband and a watch bezel, of Ti, Ti alloy, SUS304 and SUS316L at the surface thereof was provided with a hardening layer of multilayer structure by forming a first nitride layer of, for example, HfN, TiN or ZrN and a second nitride layer of, for example, HfN, TiN or ZrN differing from the first nitride layer to thereby constitute an undercoat layer and by forming a layer of mixture of an Au alloy and the same nitride as that constituting the second nitride layer, for example, HfN, TiN or ZrN and, superimposed on the mixture layer, an Au alloy to thereby constitute a top layer. In all of these Examples 1-1 to 1-16, in the hardness test, the Vickers hardness (Hv) was 2100 or higher, and acceptance was judged. In the abrasion resistance test, there was no exposure of the underlying base material surface after the abrasion test, and acceptance was judged. In the corrosion resistance test, no corrosion was observed after the CASS test, and acceptance was judged. Accordingly, in the comprehensive evaluation, all the Examples 1-4 to 1-16 had acceptance judgment.

By contrast, in the Comparative Examples 1-1 to 1-8, each of the decorative parts being watch external parts, including a watchcase, a watchband and a watch bezel, of Ti, Ti alloy, SUS304 and SUS316L at the surface thereof was provided with an Au—Ni coating by a wet plating method. In the abrasion resistance test, there was no exposure of the underlying base material surface after the abrasion test, and acceptance was judged. In the corrosion resistance test, no corrosion was observed after the CASS test, and acceptance was judged. However, in the hardness test, the Vickers hardness (Hv) was 680 or below, and rejection was judged. In the Comparative Examples 1-9 to 1-16, each of the watch external parts, including a watchcase, a watchband and a watch bezel, of Ti alloy, SUS304 and SUS316L at the surface thereof was provided with an Au—Pd coating by a wet plating method. In the corrosion resistance test, no corrosion was observed after the CASS test, and acceptance was judged. However, in the abrasion resistance test, there was exposure of the underlying base material surface after the abrasion test, and rejection was judged. Also, in the hardness test, the Vickers hardness (Hv) was as low as 540 or below, and rejection was judged. Accordingly, in the comprehensive evaluation, all the Comparative Examples had rejection judgment.

Second Embodiment

In the second embodiment of the first invention, the following technique of forming a hardening layer of multilayer structure was employed. In an Ar/nitrogen mixed gas plasma atmosphere, a first nitride layer consisting of an HfN layer, TiN layer or ZrN layer and a second nitride layer consisting of an HfN layer, TiN layer or ZrN layer that differed from the first nitride layer were formed to thereby provide an undercoat layer. Subsequently, the supply of nitrogen gas was stopped, and in an Ar gas plasma atmosphere, an Au alloy layer was formed to thereby provide a top layer on the undercoat layer. Thus, the hardening layer was realized.

Examples 1-17 to 1-40

The interior of a vacuum apparatus was evacuated to vacuum, and Ar and nitrogen were introduced. An Ar/nitrogen mixed gas plasma was generated, and in an atmosphere of mixed gas plasma maintained at a pressure of 0.14 Pa, using Hf, Ti or Zr, an HfN, TiN or ZrN layer as a first nitride layer was formed on the surface of an arbitrary base material according to a DC sputtering method. Likewise, an HfN, TiN or ZrN layer differing from the first nitride layer was formed as a second nitride layer, thereby providing an undercoat layer. The supply of nitrogen gas was stopped, and further in an Ar gas plasma atmosphere of the same pressure, using an Au alloy, an Au alloy layer was formed on the undercoat layer according to a DC sputtering method, thereby providing a top layer. The coating formation was carried out while regulating the coating formation time so that the thicknesses as set values are 0.5 to 0.8 μm with respect to the first nitride layer and 0.1 to 0.2 μm with respect to the second nitride layer as constituents of the undercoat layer, and so that the thickness is 0.02 μm with respect to the Au alloy layer constituting the top layer, thereby realizing a total thickness of 0.62 to 1.02 μm. Watch external parts, including a watchcase, watchband, watch bezel, caseback and intermediate clasp of materials Ti, Ti alloy, brass, SUS304 and SUS316L, were used as the arbitrary base material. An Au—Ni alloy, Au—Pd alloy and Au—Pt alloy of arbitrary composition were used in the Au alloy layer.

Table 1-3 summarizes the results of hardness test, abrasion resistance test and corrosion resistance test together with comprehensive evaluation results with respect to the decorative parts produced in Examples 1-17 to 1-40 according to the second embodiment. Exactly the same evaluation criteria as in the first embodiment were employed with respect to all of the compositions of first nitride layer, second nitride layer and Au alloy layer, hardness test, adhesion test, corrosion resistance test and comprehensive evaluation result.

TABLE 1-3

| | Type of base mat'l | Form of decorative part | Undercoat layer | | | | Top layer | |
|---|---|---|---|---|---|---|---|---|
| | | | Mat'l of 1st nitride layer | Thickness of 1st nitride layer(μm) | Mat'l of 2nd nitride layer | Thickness of 2nd nitride layer(μm) | Mat'l of Au alloy layer | Thickness of Au alloy layer(μm) |
| Example 1-17 | SUS304 | Watchcase | ZrN | 0.8 | HfN | 0.1 | Au—Ni | 0.02 |
| Example 1-18 | SUS304 | Watchband | ZrN | 0.8 | HfN | 0.2 | Au—Ni | 0.02 |
| Example 1-19 | Brass | Watchcase | ZrN | 0.8 | TiN | 0.1 | Au—Ni | 0.02 |
| Example 1-20 | SUS316L | Watchband | ZrN | 0.8 | TiN | 0.2 | Au—Ni | 0.02 |
| Example 1-21 | Brass | Watchcase | TiN | 0.8 | HfN | 0.1 | Au—Ni | 0.02 |
| Example 1-22 | Ti | Watch bezel | TiN | 0.8 | HfN | 0.2 | Au—Ni | 0.02 |
| Example 1-23 | Ti alloy | Watch bezel | TiN | 0.8 | HfN | 0.1 | Au—Ni | 0.02 |
| Example 1-24 | Ti alloy | Watchcase | TiN | 0.5 | HfN | 0.2 | Au—Ni | 0.02 |
| Example 1-25 | SUS316L | Caseback | ZrN | 0.5 | HfN | 0.1 | Au—Ni | 0.02 |
| Example 1-26 | SUS304 | Caseback | ZrN | 0.5 | HfN | 0.2 | Au—Pd | 0.02 |
| Example 1-27 | SUS316L | Intermediate clasp | ZrN | 0.5 | HfN | 0.1 | Au—Pd | 0.02 |
| Example 1-28 | SUS304 | Intermediate clasp | ZrN | 0.5 | HfN | 0.2 | Au—Ni | 0.02 |
| Example 1-29 | Ti | Watchcase | TiN | 0.5 | HfN | 0.1 | Au—Ni | 0.02 |
| Example 1-30 | Ti alloy | Watchcase | TiN | 0.5 | HfN | 0.2 | Au—Ni | 0.02 |
| Example 1-31 | SUS304 | Watchcase | TiN | 0.5 | HfN | 0.1 | Au—Pd | 0.02 |
| Example 1-32 | SUS316L | Watchcase | TiN | 0.5 | HfN | 0.2 | Au—Pd | 0.02 |
| Example 1-33 | Ti | Watchband | HfN | 0.8 | TiN | 0.1 | Au—Pd | 0.02 |
| Example 1-34 | Ti alloy | Watchband | HfN | 0.8 | ZrN | 0.2 | Au—Pd | 0.02 |
| Example 1-35 | SUS304 | Watchband | HfN | 0.8 | TiN | 0.1 | Au—Pt | 0.02 |
| Example 1-36 | SUS316L | Watchband | HfN | 0.8 | ZrN | 0.2 | Au—Pt | 0.02 |
| Example 1-37 | Ti | Watch bezel | TiN | 0.8 | ZrN | 0.1 | Au—Pt | 0.02 |
| Example 1-38 | Ti alloy | Watch bezel | TiN | 0.8 | ZrN | 0.2 | Au—Pt | 0.02 |
| Example 1-39 | SUS304 | Watch bezel | TiN | 0.8 | ZrN | 0.1 | Au—Pt | 0.02 |
| Example 1-40 | SUS316L | Watch bezel | TiN | 0.8 | ZrN | 0.2 | Au—Pt | 0.02 |

TABLE 1-3-continued

|  | Set thickness (μm) | Hardness test Micro hardness (Hv) | Abrasion resist test Exposure of underlying base mat'l | Corrosion resist test Corrosion | Comprehensive rating |
|---|---|---|---|---|---|
| Example 1-17 | 0.92 | 2230 | No | No | Accepted |
| Example 1-18 | 1.02 | 2385 | No | No | Accepted |
| Example 1-19 | 0.92 | 2235 | No | No | Accepted |
| Example 1-20 | 1.02 | 2385 | No | No | Accepted |
| Example 1-21 | 0.92 | 2240 | No | No | Accepted |
| Example 1-22 | 1.03 | 2380 | No | No | Accepted |
| Example 1-23 | 0.92 | 2230 | No | No | Accepted |
| Example 1-24 | 1.02 | 2375 | No | No | Accepted |
| Example 1-25 | 0.62 | 1735 | No | No | Accepted |
| Example 1-26 | 0.72 | 1930 | No | Ho | Accepted |
| Example 1-27 | 0.62 | 1730 | No | No | Accepted |
| Example 1-28 | 0.72 | 1925 | No | No | Accepted |
| Example 1-29 | 0.62 | 1735 | No | No | Accepted |
| Example 1-30 | 0.72 | 1930 | No | No | Accepted |
| Example 1-31 | 0.62 | 1730 | No | No | Accepted |
| Example 1-32 | 0.72 | 1930 | No | No | Accepted |
| Example 1-33 | 0.92 | 2220 | No | No | Accepted |
| Example 1-34 | 1.02 | 2380 | No | No | Accepted |
| Example 1-35 | 0.92 | 2230 | No | No | Accepted |
| Example 1-36 | 1.02 | 2370 | No | No | Accepted |
| Example 1-37 | 0.92 | 2240 | No | No | Accepted |
| Example 1-38 | 1.02 | 2375 | No | No | Accepted |
| Example 1-39 | 0.92 | 2235 | No | No | Accepted |
| Example 1-40 | 1.02 | 2380 | No | No | Accepted |

Referring to Table 1-3, each of the decorative parts of Ti, Ti alloy, brass, SUS304 and SUS316L at the surface thereof was provided with a hardening layer of multilayer structure by forming a first nitride layer consisting of an HfN layer, TiN layer or ZrN layer and, superimposed on the first nitride layer, a second nitride layer consisting of an HfN layer, TiN layer or ZrN layer differing from the first nitride layer to thereby constitute an undercoat layer and by forming an Au alloy layer on the undercoat layer to thereby constitute a top layer. In all of these Examples 1-17 to 1-40, in the hardness test, the Vickers hardness (Hv) was 1730 or higher, and acceptance was judged. In the abrasion resistance test, there was no exposure of the underlying base material surface after the abrasion test, and acceptance was judged. In the corrosion resistance test, no corrosion was observed after the CASS test, and acceptance was judged. Accordingly, in the comprehensive evaluation, all the Examples 1-17 to 1-40 had acceptance judgment.

Third Embodiment

In the third embodiment of the first invention, the following technique of forming a hardening layer of multilayer structure was employed. A metal layer of Hf, Ti or Zr was formed in an Ar gas plasma, and after introduction of nitrogen, in the resultant Ar/nitrogen mixed gas plasma atmosphere, a first nitride layer consisting of an HfN layer, TiN layer or ZrN layer and a second nitride layer consisting of an HfN layer, TiN layer or ZrN layer that differed from the first nitride layer were formed to thereby provide an undercoat layer. Subsequently, in an Ar/nitrogen mixed gas plasma atmosphere, a layer of mixture of Au alloy and HfN layer, TiN layer or ZrN layer and an Au alloy layer were formed to thereby provide a top layer on the undercoat layer. Thus, the hardening layer was realized.

Examples 1-41 to 1-74

The interior of a vacuum apparatus was evacuated to vacuum. Thereafter, Ar was introduced, and plasma was generated. In an atmosphere of Ar gas plasma maintained at a pressure of 0.2 Pa, using Hf, Ti or Zr, a metal layer consisting of an Hf layer, Ti layer or Zr layer was formed on the surface of an arbitrary base material according to a DC sputtering method. Thereafter, nitrogen gas was introduced, and in an Ar/nitrogen mixed gas plasma atmosphere of the same pressure, there were formed a first nitride layer of, for example, HfN, TiN or ZrN containing the same metal as that constituting the metal layer and a second nitride layer of, for example, HfN, TiN or ZrN differing from the first nitride layer. Further in the same gas plasma atmosphere of the same pressure, using Hf, Ti or Zr and an Au alloy, a layer of mixture of Au alloy and HfN, TiN or ZrN being the same nitride as that constituting the second nitride layer and an Au alloy layer were formed on the undercoat layer according to a DC sputtering method, thereby providing a top layer. The coating formation was carried out while regulating the coating formation time so that the thicknesses as set values are 0.15 μm with respect to the metal layer, 0.3 to 0.6 μm with respect to the first nitride layer and 0.15 μm with respect to the second nitride layer as constituents of the undercoat layer, and so that the thicknesses are 0.02 to 0.04 μm with respect to the layer of mixture of Au alloy and HfN, TiN or ZrN being the same nitride as that constituting the second nitride layer and 0.02 μm with respect to the Au alloy layer as constituents of the top layer, thereby realizing a total thickness of 0.66 to 0.96 μm. Watch external parts, including a watchcase, watchband, watch bezel, caseback and intermediate clasp of materials Ti, Ti alloy, brass, SUS304 and SUS316L, were used as the arbitrary base material. An Au—Ni alloy, Au—Pd alloy and Au—Pt alloy of arbitrary composition were used in the Au alloy layer.

Table 1-4 and Table 1-5 summarize the results of hardness test, abrasion resistance test and corrosion resistance test together with comprehensive evaluation results with respect to the decorative parts produced in Examples 1-41 to 1-74 according to the third embodiment. Exactly the same evaluation criteria as in the first embodiment were employed with respect to all of the compositions of metal layer, first nitride layer, second nitride layer, nitride/Au alloy mixture layer and Au alloy layer, hardness test, adhesion test, corrosion resistance test and comprehensive evaluation result.

TABLE 1-4

| | Type of base mat'l | Form of decorative part | Undercoat layer | | | | | |
|---|---|---|---|---|---|---|---|---|
| | | | Mat'l of metal layer | Thickness of metal layer(μm) | Mat'l of 1$^{st}$ nitride layer | Thickness of 1$^{st}$ nitride layer(μm) | Mat'l of 2$^{nd}$ nitride layer | Thickness of 2$^{nd}$ nitride layer(μm) |
| Example 1-41 | Ti | Watchcase | Zr | 0.15 | ZrN | 0.6 | HfN | 0.15 |
| Example 1-42 | Ti | Watchband | Zr | 0.15 | ZrN | 0.6 | HfN | 0.15 |
| Example 1-43 | Ti alloy | Watchcase | Zr | 0.15 | ZrN | 0.3 | HfN | 0.15 |
| Example 1-44 | Ti alloy | Watchband | Ti | 0.15 | TiN | 0.6 | HfN | 0.15 |
| Example 1-45 | SUS304 | Watchcase | Ti | 0.15 | TiN | 0.6 | HfN | 0.15 |
| Example 1-46 | SUS304 | Watchband | Ti | 0.15 | TiN | 0.3 | HfN | 0.15 |
| Example 1-47 | SUS316L | Watchcase | Ti | 0.15 | TiN | 0.6 | ZrN | 0.15 |
| Example 1-48 | SUS316L | Watchband | Ti | 0.15 | TiN | 0.3 | ZrN | 0.15 |
| Example 1-49 | SUS304 | Watch bezel | Zr | 0.15 | ZrN | 0.6 | TiN | 0.15 |
| Example 1-50 | Ti | Watch bezel | Hf | 0.15 | HfN | 0.6 | ZrN | 0.15 |
| Example 1-51 | SUS316L | Watch bezel | Hf | 0.15 | HfN | 0.6 | ZrN | 0.15 |
| Example 1-52 | Ti alloy | Watch bezel | Hf | 0.15 | HfN | 0.3 | ZrN | 0.15 |
| Example 1-53 | SUS304 | Caseback | Hf | 0.15 | HfN | 0.6 | ZrN | 0.15 |
| Example 1-54 | Ti | Caseback | Hf | 0.15 | HfN | 0.6 | TiN | 0.15 |

| | Top layer | | | | Evaluation test | | | |
|---|---|---|---|---|---|---|---|---|
| | Thickness of mixture layer (μm) | Mat'l of Au alloy layer | Thickness of Au alloy layer(μm) | Set thickness (μm) | Hardness test Micro hardness (Hv) | Abrasion resist test Exposure of underlying base mat'l | Corrosion resist test Corrosion | Comprehensive rating |
| Example 1-41 | 0.02 | Au—Ni | 0.02 | 0.94 | 2265 | No | No | Accepted |
| Example 1-42 | 0.04 | Au—Ni | 0.02 | 0.96 | 2290 | No | No | Accepted |
| Example 1-43 | 0.04 | Au—Ni | 0.02 | 0.66 | 1790 | No | No | Accepted |
| Example 1-44 | 0.02 | Au—Ni | 0.02 | 0.94 | 2255 | No | No | Accepted |
| Example 1-45 | 0.04 | Au—Ni | 0.02 | 0.96 | 2290 | No | No | Accepted |
| Example 1-46 | 0.04 | Au—Ni | 0.02 | 0.66 | 1790 | No | No | Accepted |
| Example 1-47 | 0.04 | Au—Ni | 0.02 | 0.96 | 2285 | No | No | Accepted |
| Example 1-48 | 0.04 | Au—Ni | 0.02 | 0.66 | 1795 | No | No | Accepted |
| Example 1-49 | 0.04 | Au—Ni | 0.02 | 0.96 | 2295 | No | No | Accepted |
| Example 1-50 | 0.02 | Au—Ni | 0.02 | 0.94 | 2260 | No | No | Accepted |
| Example 1-51 | 0.04 | Au—Ni | 0.02 | 0.96 | 2290 | No | No | Accepted |
| Example 1-52 | 0.04 | Au—Ni | 0.02 | 0.66 | 1795 | No | No | Accepted |
| Example 1-53 | 0.02 | Au—Ni | 0.02 | 0.94 | 2260 | No | No | Accepted |
| Example 1-54 | 0.04 | Au—Ni | 0.02 | 0.96 | 2290 | No | No | Accepted |

TABLE 1-5

| | Type of base mat'l | Form of decorative part | Undercoat layer | | | | | |
|---|---|---|---|---|---|---|---|---|
| | | | Mat'l of metal layer | Thickness of metal layer(μm) | Mat'l of 1$^{st}$ nitride layer | Thickness of 1$^{st}$ nitride layer(μm) | Mat'l of 2$^{nd}$ nitride layer | Thickness of 2$^{nd}$ nitride layer(μm) |
| Example 1-55 | SUS316L | Watchband | Hf | 0.15 | HfN | 0.6 | ZrN | 0.15 |
| Example 1-56 | SUS316L | Watch bezel | Hf | 0.15 | HfN | 0.3 | TiN | 0.15 |
| Example 1-57 | SUS316L | Caseback | Ti | 0.15 | TiN | 0.6 | ZrN | 0.15 |
| Example 1-58 | SUS316L | Intermediate clasp | Ti | 0.15 | TiN | 0.3 | ZrN | 0.15 |
| Example 1-59 | SUS304 | Watchcase | Ti | 0.15 | TiN | 0.6 | ZrN | 0.15 |
| Example 1-60 | SUS304 | Watchband | Zr | 0.15 | ZrN | 0.6 | HfN | 0.15 |
| Example 1-61 | SUS304 | Watch bezel | Zr | 0.15 | ZrN | 0.6 | HfN | 0.15 |
| Example 1-62 | SUS304 | Caseback | Ti | 0.15 | TiN | 0.3 | HfN | 0.15 |
| Example 1-63 | SUS304 | Intermediate clasp | Ti | 0.15 | TiN | 0.6 | HfN | 0.15 |
| Example 1-64 | Ti | Watchcase | Zr | 0.15 | ZrN | 0.6 | TiN | 0.15 |
| Example 1-65 | Ti | Watchband | Hf | 0.15 | HfN | 0.6 | ZrN | 0.15 |
| Example 1-66 | Ti | Watch bezel | Hf | 0.15 | HfN | 0.6 | TiN | 0.15 |
| Example 1-67 | Ti | Caseback | Ti | 0.15 | TiN | 0.6 | ZrN | 0.15 |
| Example 1-68 | Ti | Watchcase | Ti | 0.15 | TiN | 0.3 | ZrN | 0.15 |
| Example 1-69 | Ti alloy | Watchcase | Ti | 0.15 | TiN | 0.6 | ZrN | 0.15 |
| Example 1-70 | Ti alloy | Watchband | Zr | 0.15 | ZrN | 0.6 | HfN | 0.15 |

TABLE 1-5-continued

| | | | | | | | | | |
|---|---|---|---|---|---|---|---|---|---|
| Example 1-71 | Ti alloy | Watch bezel | Zr | 0.15 | ZrN | 0.6 | HfN | 0.15 | |
| Example 1-72 | Ti alloy | Caseback | Zr | 0.15 | ZrN | 0.3 | HfN | 0.15 | |
| Example 1-73 | Ti alloy | Watchcase | Ti | 0.15 | TiN | 0.6 | HfN | 0.15 | |
| Example 1-74 | Brass | Watchcase | Zr | 0.15 | ZrN | 0.6 | TiN | 0.15 | |

| | | Top Layer | | | Evaluation test | | | |
|---|---|---|---|---|---|---|---|---|
| | | | | | Hardness | Abrasion | | |
| | Thickness of mixture layer(μm) | Mat'l of Au alloy layer | Thickness of Au alloy layer(μm) | Set thickness (μm) | test Micro hardness (Hv) | resist test Exposure of underlying base mat'l | Corrosion resist test Corrosion | Comprehensive rating |
| Example 1-55 | 0.04 | Au—Pt | 0.02 | 0.96 | 2290 | No | No | Accepted |
| Example 1-56 | 0.04 | Au—Pt | 0.02 | 0.66 | 1790 | No | No | Accepted |
| Example 1-57 | 0.04 | Au—Pt | 0.02 | 0.96 | 2285 | No | No | Accepted |
| Example 1-58 | 0.04 | Au—Pt | 0.02 | 0.66 | 1785 | No | No | Accepted |
| Example 1-59 | 0.02 | Au—Pt | 0.02 | 0.94 | 2265 | No | No | Accepted |
| Example 1-60 | 0.02 | Au—Pt | 0.02 | 0.94 | 2260 | No | No | Accepted |
| Example 1-61 | 0.04 | Au—Pt | 0.02 | 0.96 | 2295 | No | No | Accepted |
| Example 1-62 | 0.04 | Au—Pt | 0.02 | 0.66 | 1790 | No | No | Accepted |
| Example 1-63 | 0.04 | Au—Pt | 0.02 | 0.96 | 2290 | No | No | Accepted |
| Example 1-64 | 0.04 | Au—Pt | 0.02 | 0.96 | 2290 | No | No | Accepted |
| Example 1-65 | 0.04 | Au—Pd | 0.02 | 0.96 | 2300 | No | No | Accepted |
| Example 1-66 | 0.04 | Au—Pd | 0.02 | 0.96 | 2285 | No | No | Accepted |
| Example 1-67 | 0.02 | Au—Pd | 0.02 | 0.94 | 2255 | No | No | Accepted |
| Example 1-68 | 0.04 | Au—Pd | 0.02 | 0.66 | 1795 | No | No | Accepted |
| Example 1-69 | 0.04 | Au—Pd | 0.02 | 0.96 | 2290 | No | No | Accepted |
| Example 1-70 | 0.02 | Au—Pd | 0.02 | 0.94 | 2260 | No | No | Accepted |
| Example 1-71 | 0.04 | Au—Pd | 0.02 | 0.96 | 2290 | No | No | Accepted |
| Example 1-72 | 0.04 | Au—Pd | 0.02 | 0.66 | 1790 | No | No | Accepted |
| Example 1-73 | 0.04 | Au—Pd | 0.02 | 0.96 | 2285 | No | No | Accepted |
| Example 1-74 | 0.04 | Au—Pd | 0.02 | 0.96 | 2290 | No | No | Accepted |

Referring to Table 1-4 and Table 1-5, each of the decorative parts of Ti, Ti alloy, brass, SUS304 and SUS316L at the surface thereof was provided with a hardening layer of multilayer structure by sequentially forming a metal layer consisting of an Hf layer, Ti layer or Zr layer, a first nitride layer consisting of an HfN layer, TiN layer or ZrN layer and, superimposed on the first nitride layer, a second nitride layer consisting of an HfN layer, TiN layer or ZrN layer differing from the first nitride layer to thereby constitute an undercoat layer and thereafter by sequentially forming a layer of mixture of Au alloy and HfN, TiN or ZrN being the same nitride as that constituting the second nitride layer and an Au alloy layer on the undercoat layer to thereby constitute a top layer. In all of these Examples 1-41 to 1-74, in the hardness test, the Vickers hardness (Hv) was 1785 or higher, and acceptance was judged. In the abrasion resistance test, there was no exposure of the underlying base material surface after the abrasion test, and acceptance was judged. In the corrosion resistance test, no corrosion was observed after the CASS test, and acceptance was judged. Accordingly, in the comprehensive evaluation, all the Examples 1-41 to 1-74 had acceptance judgment.

Fourth Embodiment

In the fourth embodiment of the first invention, the following technique of forming a hardening layer of multilayer structure was employed. A metal layer of Hf, Ti or Zr was formed in an Ar gas plasma, and after introduction of nitrogen, in the resultant Ar/nitrogen mixed gas plasma atmosphere, a first nitride layer consisting of an HfN layer, TiN layer or ZrN layer and a second nitride layer consisting of an HfN layer, TiN layer or ZrN layer that differed from the first nitride layer were formed to thereby provide an undercoat layer. Thereafter, the supply of nitrogen gas was stopped, and further in an Ar gas plasma atmosphere of unchanged pressure, an Au alloy layer was formed on the undercoat layer, thereby providing a top layer. Thus, the hardening layer was realized.

Examples 1-75 to 1-96

The interior of a vacuum apparatus was evacuated to vacuum. Thereafter, Ar was introduced, and plasma was generated. In an atmosphere of Ar gas plasma maintained at a pressure of 0.27 Pa, using Hf, Ti or Zr, a metal layer consisting of an Hf layer, Ti layer or Zr layer was formed on the surface of an arbitrary base material according to a DC sputtering method. Thereafter, nitrogen gas was introduced, and in an Ar/nitrogen mixed gas plasma atmosphere of the same pressure, there were formed a first nitride layer of, for example, HfN, TiN or ZrN containing the same metal as that constituting the metal layer and, superimposed on the first nitride layer, a second nitride layer of, for example, HfN, TiN or ZrN differing from the first nitride layer. The supply of nitrogen gas was stopped, and further in an Ar gas plasma atmosphere of the same pressure, using an Au alloy, an Au alloy layer was formed on the undercoat layer according to a DC sputtering method, thereby providing a top layer. The coating formation was carried out while regulating the coating formation time so that the thicknesses as set values are 0.15 μm with respect to the metal layer, 0.5 to 0.8 μm with respect to the first nitride layer and 0.15 μm with respect to the second nitride layer as constituents of the undercoat layer, and so that the thickness is 0.02 to 0.03 μm with respect to the Au alloy layer as the constituent of the top layer, thereby realizing a total thickness of 0.82 to 1.13 μm. Watch external parts, including a watchcase, watchband, watch bezel and caseback of materials Ti, Ti alloy, brass, SUS304 and SUS316L, were used as the arbitrary base material. An Au—Ni alloy, Au—Pd alloy and Au—Pt alloy of arbitrary composition were used in the Au alloy layer.

Table 1-6 summarizes the results of hardness test, abrasion resistance test and corrosion resistance test together with comprehensive evaluation results with respect to the decorative parts produced in Examples 1-75 to 1-96 according to the fourth embodiment. Exactly the same evaluation criteria as in the first embodiment were employed with respect to all of the compositions of metal layer, first nitride layer, second nitride layer and Au alloy layer, hardness test, adhesion test, corrosion resistance test and comprehensive evaluation result.

Referring to Table 1-6, each of the decorative parts of Ti, Ti alloy, brass, SUS304 and SUS316L at the surface thereof was provided with a hardening layer of multilayer structure by sequentially forming a metal layer consisting of an Hf layer, Ti layer or Zr layer, a first nitride layer consisting of an HfN layer, TiN layer or ZrN layer and, superimposed on the first nitride layer, a second nitride layer consisting of an HfN layer, TiN layer or ZrN layer differing from the first nitride layer to thereby constitute an undercoat layer and thereafter by forming an Au alloy layer to thereby constitute the hardening layer. In all of these Examples 1-75 to 1-96, in the hardness test, the Vickers hardness (Hv) was 2070 or higher, and acceptance was judged. In the abrasion resistance test, there was no

TABLE 1-6

| | | | | | Undercoat layer | | | |
|---|---|---|---|---|---|---|---|---|
| | Type of base mat'l | Form of decorative part | Mat'l of metal layer | Thickness of metal layer(μm) | Mat'l of 1st nitride layer | Thickness of 1st nitride layer(μm) | Mat'l of 2nd nitride layer | Thickness of 2nd nitride layer(μm) |
| Example 1-75 | SUS316L | Watchcase | Zr | 0.15 | ZrN | 0.8 | HfN | 0.15 |
| Example 1-76 | SUS316L | Watchband | Ti | 0.15 | TiN | 0.8 | HfN | 0.15 |
| Example 1-77 | SUS316L | Watch bezel | Hf | 0.15 | HfN | 0.8 | ZrN | 0.15 |
| Example 1-78 | SUS316L | Caseback | Ti | 0.15 | TiN | 0.8 | ZrN | 0.15 |
| Example 1-79 | SUS316L | Watchband | Hf | 0.15 | HfN | 0.8 | TiN | 0.15 |
| Example 1-80 | SUS304 | Watchcase | Zr | 0.15 | ZrN | 0.8 | TiN | 0.15 |
| Example 1-81 | SUS304 | Watchband | Zr | 0.15 | ZrN | 0.5 | HfN | 0.15 |
| Example 1-82 | SUS304 | Watch bezel | Ti | 0.15 | TiN | 0.5 | HfN | 0.15 |
| Example 1-83 | SUS304 | Caseback | Hf | 0.15 | HfN | 0.5 | ZrN | 0.15 |
| Example 1-84 | SUS304 | Watchband | Ti | 0.15 | TiN | 0.5 | ZrN | 0.15 |
| Example 1-85 | Ti | Watchcase | Zr | 0.15 | ZrN | 0.5 | HfN | 0.15 |
| Example 1-86 | Ti | Watchband | Ti | 0.15 | TiN | 0.5 | HfN | 0.15 |
| Example 1-87 | Ti | Watch bezel | Hf | 0.15 | HfN | 0.5 | ZrN | 0.15 |
| Example 1-88 | Ti | Caseback | Ti | 0.15 | TiN | 0.5 | ZrN | 0.15 |
| Example 1-89 | Ti | Watchband | Hf | 0.15 | HfN | 0.5 | TiN | 0.15 |
| Example 1-90 | Ti alloy | Watchcase | Zr | 0.15 | ZrN | 0.5 | TiN | 0.15 |
| Example 1-99 | Ti alloy | Watchband | Zr | 0.15 | ZrN | 0.5 | HfN | 0.15 |
| Example 1-92 | Ti alloy | Watch bezel | Ti | 0.15 | TiN | 0.5 | HfN | 0.15 |
| Example 1-93 | Ti alloy | Caseback | Hf | 0.15 | HfN | 0.5 | ZrN | 0.15 |
| Example 1-94 | Ti alloy | Watchband | Ti | 0.15 | TiN | 0.5 | ZrH | 0.15 |
| Example 1-95 | Brass | Watchcase | Hf | 0.15 | HfN | 0.5 | TiN | 0.15 |
| Example 1-96 | Brass | Watchcase | Zr | 0.15 | ZrN | 0.5 | TiN | 0.15 |

| | Top layer | | | Evaluation test | | | |
|---|---|---|---|---|---|---|---|
| | Mat'l of Au alloy layer | Thickness of Au alloy layer(μm) | Set thickness (μm) | Hardness test Micro hardness (Hv) | Abrasion resist test Exposure of underlying base mat'l | Corrosion resist test Corrosion | Comprehensive rating |
| Example 1-75 | Au—Ni | 0.02 | 1.12 | 2530 | No | No | Accepted |
| Example 1-76 | Au—Ni | 0.03 | 1.13 | 2545 | No | No | Accepted |
| Example 1-77 | Au—Ni | 0.02 | 1.12 | 2535 | No | No | Accepted |
| Example 1-78 | Au—Ni | 0.03 | 1.13 | 2540 | No | No | Accepted |
| Example 1-79 | Au—Ni | 0.02 | 1.12 | 2530 | No | No | Accepted |
| Example 1-80 | Au—Ni | 0.03 | 1.13 | 2540 | No | No | Accepted |
| Example 1-81 | Au—Ni | 0.02 | 0.82 | 2080 | No | No | Accepted |
| Example 1-82 | Au—Ni | 0.03 | 0.83 | 2090 | No | No | Accepted |
| Example 1-83 | Au—Ni | 0.02 | 0.82 | 2075 | No | No | Accepted |
| Example 1-84 | Au—Ni | 0.03 | 0.83 | 2095 | No | No | Accepted |
| Example 1-85 | Au—Pd | 0.02 | 0.82 | 2080 | No | No | Accepted |
| Example 1-86 | Au—Pd | 0.03 | 0.83 | 2100 | No | No | Accepted |
| Example 1-87 | Au—Pd | 0.02 | 0.82 | 2075 | No | No | Accepted |
| Example 1-88 | Au—Pd | 0.03 | 0.83 | 2095 | No | No | Accepted |
| Example 1-89 | Au—Pd | 0.02 | 0.82 | 2070 | No | No | Accepted |
| Example 1-90 | Au—Pd | 0.03 | 0.83 | 2090 | No | No | Accepted |
| Example 1-99 | Au—Pt | 0.02 | 0.82 | 2080 | No | No | Accepted |
| Example 1-92 | Au—Pt | 0.03 | 0.83 | 2095 | No | No | Accepted |
| Example 1-93 | Au—Pt | 0.02 | 0.82 | 2085 | No | No | Accepted |
| Example 1-94 | Au—Pt | 0.03 | 0.83 | 2095 | No | No | Accepted |
| Example 1-95 | Au—Pt | 0.02 | 0.82 | 2085 | No | No | Accepted |
| Example 1-96 | Au—Pt | 0.03 | 0.83 | 2100 | No | No | Accepted | exposure of the underlying base material surface after the abrasion test, and acceptance was judged. In the corrosion resistance test, no corrosion was observed after the CASS test, and acceptance was judged. Accordingly, in the comprehensive evaluation, all the Examples 1-75 to 1-96 had acceptance judgment.

Fifth Embodiment

In the fifth embodiment of the first invention, the following technique of forming a hardening layer of multilayer structure was employed. In an Ar/nitrogen mixed gas plasma atmosphere, using a nitride target of, for example, TiN, HfN or ZrN, a first nitride layer consisting of a TiN layer, HfN layer or ZrN layer and a second nitride layer consisting of a TiN layer, HfN layer or ZrN layer that differed from the first nitride layer were formed to thereby provide an undercoat layer. Subsequently, in an Ar/nitrogen mixed gas plasma atmosphere, a layer of mixture of Au alloy and HfN layer, TiN layer or ZrN layer and an Au alloy layer were formed to thereby provide a top layer on the undercoat layer. Thus, the hardening layer was realized.

Examples 1-97 to 1-116

The interior of a vacuum apparatus was evacuated to vacuum. Thereafter, Ar and nitrogen were introduced, and an Ar/nitrogen mixed gas plasma was generated. In the mixed gas plasma atmosphere maintained at a pressure of 0.2 Pa, using an HfN, TiN or ZrN target, a first nitride layer consisting of a TiN layer, HfN layer or ZrN layer and a second nitride layer consisting of a TiN layer, HfN layer or ZrN layer that differed from the first nitride layer were formed on the surface of an arbitrary base material according to an RF sputtering method. Further in the same gas plasma atmosphere of the same pressure, using an HfN, TiN or ZrN target and an Au alloy, a layer of mixture of Au alloy and HfN, TiN or ZrN being the same nitride as that constituting the second nitride layer and an Au alloy layer were formed on the undercoat layer according to an RF sputtering method, thereby providing a top layer. The coating formation was carried out while regulating the coating formation time so that the thicknesses as set values are 0.4 to 1.0 μm with respect to the first nitride layer and 0.15 μm with respect to the second nitride layer as constituents of the undercoat layer, and so that the thicknesses are 0.03 μm with respect to the layer of mixture of Au alloy and HfN, TiN or ZrN being the same nitride as that constituting the second nitride layer and 0.02 μm with respect to the Au alloy layer as constituents of the top layer, thereby realizing a total thickness of 0.6 to 1.2 μm. Watch external parts, including a watchcase, watchband, watch bezel, caseback and intermediate clasp of materials Ti, Ti alloy, SUS304 and SUS316L, were used as the arbitrary base material. An Au—Ni alloy, Au—Pd alloy and Au—Pt alloy of arbitrary composition were used in the Au alloy layer.

Table 1-7 summarizes the results of hardness test, abrasion resistance test and corrosion resistance test together with comprehensive evaluation results with respect to the decorative parts produced in Examples 1-97 to 1-116 according to the fifth embodiment. Exactly the same evaluation criteria as in the first embodiment were employed with respect to all of the compositions of first nitride layer, second nitride layer, nitride/Au alloy mixture layer and Au alloy layer, hardness test, adhesion test, corrosion resistance test and comprehensive evaluation result.

TABLE 1-7

|  | Type of base mat'l | Form of decorative part | Undercoat layer | | | | Top layer | | |
|---|---|---|---|---|---|---|---|---|---|
|  |  |  | Mat'l of 1$^{st}$ nitride layer | Thickness of 1$^{st}$ nitride layer(μm) | Mat'l of 2$^{nd}$ nitride layer | Thickness of 2$^{nd}$ nitride layer(μm) | Thickness of mixture layer(μm) | Mat'l of Au alloy layer | Thickness of Au alloy layer(μm) |
| Example 1-97 | SUS304 | Caseback | ZrN | 0.4 | HfN | 0.15 | 0.03 | Au—Ni | 0.02 |
| Example 1-98 | SUS304 | Watchband | ZrN | 1 | HfN | 0.15 | 0.03 | Au—Ni | 0.02 |
| Example 1-99 | SUS304 | Intermediate clasp | TiN | 0.4 | HfN | 0.15 | 0.03 | Au—Ni | 0.02 |
| Example 1-100 | SUS304 | Watchcase | TiN | 1 | HfN | 0.15 | 0.03 | Au—Ni | 0.02 |
| Example 1-101 | SUS304 | Caseback | HfN | 0.4 | ZrN | 0.15 | 0.03 | Au—Ni | 0.02 |
| Example 1-102 | Ti alloy | Watchcase | HfN | 1 | ZrN | 0.15 | 0.03 | Au—Ni | 0.02 |
| Example 1-103 | Ti alloy | Intermediate clasp | TiN | 0.4 | ZrN | 0.15 | 0.03 | Au—Ni | 0.02 |
| Example 1-104 | Ti alloy | Watch bezel | TiN | 1 | ZrN | 0.15 | 0.03 | Au—Ni | 0.02 |
| Example 1-105 | Ti allay | Caseback | ZrN | 0.4 | TiN | 0.15 | 0.03 | Au—Ni | 0.02 |
| Example 1-106 | Ti alloy | Watchcase | ZrN | 1 | TiN | 0.15 | 0.03 | Au—Ni | 0.02 |
| Example 1-107 | Ti | Caseback | HfN | 0.4 | TiN | 0.15 | 0.03 | Au—Ni | 0.02 |
| Example 1-108 | Ti | Watchband | HfN | 1 | TiN | 0.15 | 0.03 | Au—Ni | 0.02 |
| Example 1-109 | Ti | Watch bezel | ZrN | 1 | HfN | 0.15 | 0.03 | Au—Pt | 0.02 |
| Example 1-110 | Ti | Watchband | TiN | 1 | HfN | 0.15 | 0.03 | Au—Pt | 0.02 |
| Example 1-111 | Ti | Watchcase | HfN | 1 | ZrN | 0.15 | 0.03 | Au—Pt | 0.02 |
| Example 1-112 | SUS316L | Watchcase | TiN | 1 | ZrN | 0.15 | 0.03 | Au—Pt | 0.02 |
| Example 1-113 | SUS316L | Watchband | ZrN | 1 | HfN | 0.15 | 0.03 | Au—Pd | 0.02 |
| Example 1-114 | SUS316L | Watch bezel | TiN | 1 | HfN | 0.15 | 0.03 | Au—Pd | 0.02 |
| Example 1-115 | SUS316L | Watchband | HfN | 1 | ZrN | 0.15 | 0.03 | Au—Pd | 0.02 |
| Example 1-116 | SUS316L | Watchcase | TiN | 1 | ZrN | 0.15 | 0.03 | Au—Pd | 0.02 |

TABLE 1-7-continued

|  | Set thickness (μm) | Hardness test Micro hardness (Hv) | Abrasion resist test Exposure of underlying base mat'l | Corrosion resist test Corrosion | Comprehensive rating |
|---|---|---|---|---|---|
| Example 1-97 | 0.60 | 1690 | No | No | Accepted |
| Example 1-98 | 1.20 | 2655 | No | No | Accepted |
| Example 1-99 | 0.60 | 1695 | No | No | Accepted |
| Example 1-100 | 1.20 | 2650 | No | No | Accepted |
| Example 1-101 | 0.60 | 1690 | No | No | Accepted |
| Example 1-102 | 1.20 | 2655 | No | No | Accepted |
| Example 1-103 | 0.60 | 1695 | No | No | Accepted |
| Example 1-104 | 1.20 | 2650 | No | No | Accepted |
| Example 1-105 | 0.60 | 1700 | No | No | Accepted |
| Example 1-106 | 1.20 | 2645 | No | No | Accepted |
| Example 1-107 | 0.60 | 1700 | No | No | Accepted |
| Example 1-108 | 1.20 | 2650 | No | No | Accepted |
| Example 1-109 | 1.20 | 2655 | No | No | Accepted |
| Example 1-110 | 1.20 | 2650 | No | No | Accepted |
| Example 1-111 | 1.20 | 2645 | No | No | Accepted |
| Example 1-112 | 1.20 | 2650 | No | No | Accepted |
| Example 1-113 | 1.20 | 2650 | No | No | Accepted |
| Example 1-114 | 1.20 | 2645 | No | No | Accepted |
| Example 1-115 | 1.20 | 2650 | No | No | Accepted |
| Example 1-116 | 1.20 | 2650 | No | No | Accepted |

Referring to Table 1-7, each of the decorative parts of Ti, Ti alloy, SUS304 and SUS316L at the surface thereof was provided with a hardening layer of multilayer structure by sequentially forming a first nitride layer consisting of an HfN layer, TiN layer or ZrN layer and, superimposed on the first nitride layer and a second nitride layer consisting of an HfN layer, TiN layer or ZrN layer differing from the first nitride layer to thereby constitute an undercoat layer and thereafter by sequentially forming a layer of mixture of Au alloy and HfN, TiN or ZrN being the same nitride as that constituting the second nitride layer and an Au alloy layer on the undercoat layer to thereby constitute a top layer. In all of these Examples 1-97 to 1-116, in the hardness test, the Vickers hardness (Hv) was 1690 or higher, and acceptance was judged. In the abrasion resistance test, there was no exposure of the underlying base material surface after the abrasion test, and acceptance was judged. In the corrosion resistance test, no corrosion was observed after the CASS test, and acceptance was judged. Accordingly, in the comprehensive evaluation, all the Examples 1-97 to 1-116 had acceptance judgment.

Sixth Embodiment

In the sixth embodiment of the first invention, the following technique of forming a hardening layer of multilayer structure was employed. A metal layer of Hf, Ti or Zr was formed in an He gas plasma, and after introduction of nitrogen gas, in the resultant He/nitrogen mixed gas plasma atmosphere, a first nitride layer consisting of an HfN layer, TiN layer or ZrN layer and a second nitride layer consisting of an HfN layer, TiN layer or ZrN layer that differed from the first nitride layer were formed to thereby provide an undercoat layer. Subsequently, in an He/nitrogen mixed gas plasma atmosphere, a layer of mixture of Au alloy and HfN layer, TiN layer or ZrN layer and an Au alloy layer were formed to thereby provide a top layer on the undercoat layer. Thus, the hardening layer was realized.

Examples 1-117 to 1-134

The interior of a vacuum apparatus was evacuated to vacuum. Thereafter, He was introduced, and plasma was generated. In an atmosphere of He gas plasma maintained at a pressure of 0.2 Pa, using Hf, Ti or Zr, a metal layer consisting of an Hf layer, Ti layer or Zr layer was formed on the surface of an arbitrary base material according to a DC sputtering method. Thereafter, nitrogen gas was introduced, and in an He/nitrogen mixed gas plasma atmosphere of the same pressure, there were formed a first nitride layer of, for example, HfN, TiN or ZrN containing the same metal as that constituting the metal layer and a second nitride layer of, for example, HfN, TiN or ZrN differing from the first nitride layer. Further in the same gas plasma atmosphere of the same pressure, using Hf, Ti or Zr and an Au alloy, a layer of mixture of Au alloy and HfN, TiN or ZrN being the same nitride as that constituting the second nitride layer and an Au alloy layer were formed on the undercoat layer according to a DC sputtering method, thereby providing a top layer. The coating formation was carried out while regulating the coating formation time so that the thicknesses as set values are 0.15 μm with respect to the metal layer, 0.9 μm with respect to the first nitride layer and 0.15 μm with respect to the second nitride layer as constituents of the undercoat layer, and so that the thicknesses are 0.03 μm with respect to the layer of mixture of Au alloy and HfN, TiN or ZrN being the same nitride as that constituting the second nitride layer and 0.03 μm with respect to the Au alloy layer as constituents of the top layer, thereby realizing a total thickness of 1.26 μm. Watch external parts, including a watchcase, watchband and watch bezel of materials Ti, Ti alloy, SUS304 and SUS316L, were used as the arbitrary base material. An Au—Ni alloy, Au—Pd alloy and Au—Pt alloy of arbitrary composition were used in the Au alloy layer.

Table 1-8 summarizes the results of hardness test, abrasion resistance test and corrosion resistance test together with comprehensive evaluation results with respect to the decorative parts produced in Examples 1-117 to 1-134 according to the sixth embodiment. Exactly the same evaluation criteria as in the first embodiment were employed with respect to all of the compositions of metal layer, first nitride layer, second nitride layer, nitride/Au alloy mixture layer and Au alloy layer, hardness test, adhesion test, corrosion resistance test and comprehensive evaluation result.

TABLE 1-8

| | Type of base mat'l | Form of decorative part | Mat'l of metal layer | Thickness of metal layer(μm) | Mat'l of 1$^{st}$ nitride layer | Thickness of 1$^{st}$ nitride layer(μm) | Mat'l of 2$^{nd}$ nitride layer | Thickness of 2$^{nd}$ nitride layer(μm) |
|---|---|---|---|---|---|---|---|---|
| Example 1-117 | Ti | Watchcase | Hf | 0.15 | HfN | 0.9 | ZrN | 0.15 |
| Example 1-118 | Ti | Watchband | Hf | 0.15 | HfN | 0.9 | TiN | 0.15 |
| Example 1-119 | Ti alloy | Watchcase | Ti | 0.15 | TiN | 0.9 | HfN | 0.15 |
| Example 1-120 | Ti alloy | Watchband | Ti | 0.15 | TiN | 0.9 | ZrN | 0.15 |
| Example 1-121 | SUS304 | Watchcase | Zr | 0.15 | ZrN | 0.9 | HfN | 0.15 |
| Example 1-122 | SUS304 | Watchband | Zr | 0.15 | ZrN | 0.9 | TiN | 0.15 |
| Example 1-123 | SUS316L | Watchcase | Hf | 0.15 | HfN | 0.9 | ZrN | 0.15 |
| Example 1-124 | SUS316L | Watchband | Hf | 0.15 | HfN | 0.9 | TiN | 0.15 |
| Example 1-125 | SUS304 | Watch bezel | Ti | 0.15 | TiN | 0.9 | HfN | 0.15 |
| Example 1-126 | Ti | Watch bezel | Ti | 0.15 | TiN | 0.9 | ZrN | 0.15 |
| Example 1-127 | SUS316L | Watch bezel | Zr | 0.15 | ZrN | 0.9 | HfN | 0.15 |
| Example 1-128 | Ti alloy | Watch bezel | Zr | 0.15 | ZrN | 0.9 | TiN | 0.15 |
| Example 1-129 | SUS304 | Watchband | Hf | 0.15 | HfN | 0.9 | ZrN | 0.15 |
| Example 1-130 | Ti | Watchband | Hf | 0.15 | HfN | 0.9 | TiN | 0.15 |
| Example 1-131 | Ti alloy | Watchband | Ti | 0.15 | TiN | 0.9 | HfN | 0.15 |
| Example 1-132 | SUS316L | Watchband | Ti | 0.15 | TiN | 0.9 | ZrN | 0.15 |
| Example 1-133 | Ti | Watchband | Zr | 0.15 | ZrN | 0.9 | HfN | 0.15 |
| Example 1-134 | Ti | Watchband | Zr | 0.15 | ZrN | 0.9 | TiN | 0.15 |

| | Thickness of mixture layer(μm) | Mat'l of Au alloy layer | Thickness of Au alloy layer(μm) | Set thickness (μm) | test Micro hardness (Hv) | resist test Exposure of underlying base mat'l | Corrosion resist test Corrosion | Comprehensive rating |
|---|---|---|---|---|---|---|---|---|
| Example 1-117 | 0.03 | Au—Ni | 0.03 | 1.26 | 2740 | No | No | Accepted |
| Example 1-118 | 0.03 | Au—Ni | 0.03 | 1.26 | 2750 | No | No | Accepted |
| Example 1-119 | 0.03 | Au—Ni | 0.03 | 1.26 | 2745 | No | No | Accepted |
| Example 1-120 | 0.03 | Au—Ni | 0.03 | 1.26 | 2740 | No | No | Accepted |
| Example 1-121 | 0.03 | Au—Ni | 0.03 | 1.26 | 2750 | No | No | Accepted |
| Example 1-122 | 0.03 | Au—Ni | 0.03 | 1.26 | 2740 | No | No | Accepted |
| Example 1-123 | 0.03 | Au—Pt | 0.03 | 1.26 | 2740 | No | No | Accepted |
| Example 1-124 | 0.03 | Au—Pt | 0.03 | 1.26 | 2740 | No | No | Accepted |
| Example 1-125 | 0.03 | Au—Pt | 0.03 | 1.26 | 2740 | No | No | Accepted |
| Example 1-126 | 0.03 | Au—Pt | 0.03 | 1.26 | 2735 | No | No | Accepted |
| Example 1-127 | 0.03 | Au—Pt | 0.03 | 1.26 | 2740 | No | No | Accepted |
| Example 1-128 | 0.03 | Au—Pt | 0.03 | 1.26 | 2735 | No | No | Accepted |
| Example 1-129 | 0.03 | Au—Pd | 0.03 | 1.26 | 2740 | No | No | Accepted |
| Example 1-130 | 0.03 | Au—Pd | 0.03 | 1.26 | 2730 | No | No | Accepted |
| Example 1-131 | 0.03 | Au—Pd | 0.03 | 1.26 | 2740 | No | No | Accepted |
| Example 1-132 | 0.03 | Au—Pd | 0.03 | 1.26 | 2740 | No | No | Accepted |
| Example 1-133 | 0.03 | Au—Pd | 0.03 | 1.26 | 2740 | No | No | Accepted |
| Example 1-134 | 0.03 | Au—Pd | 0.03 | 1.26 | 2730 | No | No | Accepted |

Referring to Table 1-8, each of the decorative parts of Ti, Ti alloy, SUS304 and SUS316L at the surface thereof was provided with a hardening layer of multilayer structure by sequentially forming a metal layer consisting of an Hf layer, Ti layer or Zr layer, a first nitride layer consisting of an HfN layer, TiN layer or ZrN layer and, superimposed on the first nitride layer, a second nitride layer consisting of an HfN layer, TiN layer or ZrN layer differing from the first nitride layer to thereby constitute an undercoat layer and thereafter by sequentially forming a layer of mixture of Au alloy and HfN, TiN or ZrN being the same nitride as that constituting the second nitride layer and an Au alloy layer on the undercoat layer to thereby constitute a top layer. In all of these Examples 1-117 to 1-134, in the hardness test, the Vickers hardness (Hv) was 2730 or higher, and acceptance was judged. In the abrasion resistance test, there was no exposure of the underlying base material surface after the abrasion test, and acceptance was judged. In the corrosion resistance test, no corrosion was observed after the CASS test, and acceptance was judged. Accordingly, in the comprehensive evaluation, all the Examples 1-117 to 1-134 had acceptance judgment.

In the above embodiments, Ti, a Ti alloy, brass, SUS304 and SUS316L were employed as the base material. However, the base material is not limited thereto, and materials of Al, various Al alloys, various stainless steels, various Ti alloys, copper alloys and the like can be used as the base material.

In the first invention, an RF sputtering method was employed in the fifth embodiment and a DC sputtering method employed in the embodiments other than the fifth embodiment as means for evaporating metals, metal nitrides and Au alloys. The reason for the employment is easy control of alloy compositions. There is no need to limit the means to an RF sputtering method and a DC sputtering method, and any other sputtering methods inclusive of a DC magnetron sputtering method and an RF magnetron sputtering method can be employed. Further, the sputtering method is not limiting, and as long as a dry processing is ensured, other PVD techniques, such as an ion plating method and an ion beam vapor deposition method, might as well be used. Likewise, both the RF method and the DC method may be used as means for plasma generation.

With respect to the pressure conditions for formation of the hardening layer, the pressure of the gas plasma atmosphere was 0.2 Pa in the first embodiment, third embodiment, fifth embodiment and sixth embodiment, 0.14 Pa in the second embodiment, and 0.27 Pa in the fourth embodiment. However, there is no need to limit the gas plasma pressure to these values, and as long as gas plasma can be generated, the pressure may be any arbitrary value.

As the inert gas, Ar was used in the first embodiment, second embodiment, third embodiment, fourth embodiment and fifth embodiment, and He was used in the sixth embodiment. The inert gas was used for plasma generation, and is not limited to Ar and He. Other inert gases, such as Xe and Kr, may be used instead. (The above relates to the embodiments of the first invention.)

Now, Examples of the second invention will be described.

Example 2-1

(Golden Decorative Piece)
Stainless steel (SUS316L) was machined to thereby obtain a base material for watchcase. The base material was washed and degreased with an organic solvent. The base material was fitted in a sputtering apparatus.

Subsequently, a hafnium nitride plated coating with golden color tone (golden hard coating) having a thickness of 1.0 µm was formed on the surface of the base material by a sputtering method under the following coating formation conditions:
<Coating Formation Condition>
  sputtering target: hafnium,
  sputtering electric power: 3 kW,
  gas: argon, nitrogen,
  coating formation pressure: 0.1 Pa, and
  acceleration voltage (bias voltage): ground to −200 V.

Thereafter, a gold/nickel mixture plated coating with golden color tone (golden outermost coating) having a thickness of 0.03 µm was formed on the surface of the hafnium nitride plated coating provided on the surface of the base material by a sputtering method under the following coating formation conditions. As a result, a golden watchcase having a color tone of 1N-14 in terms of Swiss gold plating color standards was obtained.

The color tone thereof was L*:84.51, a*:3.97 and b*:27.04 (the measurement of L*, a* and b* was carried out on a test piece with mirror surface glaze by the use of Spectrophotometer CM503d manufactured by Konica Minolta Holdings, Inc. in accordance with the method of measuring a material color by 0-deg. viewing field XYZ system provided for in CIE standards).

The reflectance with reference to wavelength of the golden decorative piece was measured by the use of Spectrophotometer CM503d manufactured by Konica Minolta Holdings, Inc. The results are shown in FIG. 2-1.
<Coating Formation Condition>
  sputtering target: gold, nickel alloy,
  sputtering electric power: 1 kW,
  gas: argon,
  coating formation pressure: 0.2 Pa, and
  acceleration voltage (bias voltage): ground to −100 V.

The thus obtained golden decorative piece consists of the base material for decorative piece (stainless steel), the golden hard coating (hafnium nitride: 1.0 µm coating thickness) and the golden outermost coating (gold-nickel alloy: 0.03 µm coating thickness).

(Evaluation)
(1) Marring Evaluation
The surface of the obtained golden decorative piece was marred with the use of abrasion tester [trade name NUS-ISO-2] manufactured by ruga Test Instruments Co., Ltd. in the following manner.

In particular, marring of a test specimen was tested by bringing a polishing paper into contact therewith under pressure under such conditions that as the polishing paper pasted onto an abrasion wheel, use was made of a lapping film (film surface provided with $Cr_2O_3$ grains of 0.5 µm grain diameter), and that the contact load between the polishing paper and the test specimen was 500 g, and that the number of relative reciprocations between the polishing paper and the test specimen was 50.

Five judges compared by visual inspection any blemish made by the marring with the blemishes on reference samples (samples obtained by marring test specimens of Examples 2-32 to 2-35 were employed as the reference samples). The blemish made on the surface of the golden decorative piece was evaluated on the following criteria. The results are shown in Table 2-1.

The surfaces of the reference samples were provided with blemishes representing the visibilities of blemishes of ratings ⊚, ○, ▲ and x.
  ⊚: blemish unnoticeable (blemish visibility extremely low)
  ○: blemish hardly noticeable (blemish visibility low)
  ▲: blemish slightly noticeable (blemish slightly visible)
  x: blemish clearly noticeable (blemish visible)

(2) Corrosion Resistance Test
In accordance with the method of corrosion resistance test (CASS test) provided for in JIS H 8502, a saline solution added with acetic acid and a small amount of cupric chloride was sprayed on the surface of the obtained golden decorative piece, and the corrosion resistance of the surface was evaluated on the following criteria. The results are shown in Table 2-1.
  ○: no change
  ▲: slight partial color change found
  x: overall color change found (3) Coloration Test
The coloration of the surface of the obtained golden decorative piece was measured by the use of Spectrophotometer CM503d manufactured by Konica Minolta Holdings, Inc. and evaluated on the following criteria. The results are shown in Table 2-1.
  ⊚: higher than L* 84.5
  ○: L* 83.5 to 84.5
  ▲: L* 82.5 to 83.5
  x: L* lower than 82.5

Example 2-2

(Production of Golden Decorative Piece)
In the same conditions as in Example 2-1, a base material for watchcase on its surface was provided with a hafnium nitride plated coating (golden hard coating).

Thereafter, a gold/palladium mixture plated coating with golden color tone (golden outermost coating) having a thickness of 0.03 µm was formed on the surface of the hafnium nitride plated coating by a sputtering method under the following coating formation conditions. As a result, a watchcase having a golden color tone slightly darker than the color tone 1N-14 in terms of Swiss gold plating color standards was obtained.

The color tone thereof was L*:83.67, a*:4.54 and b*:28.17.
<Coating Formation Condition>
  sputtering target: gold, palladium alloy,
  sputtering electric power: 1 kW,
  gas: argon,
  coating formation pressure: 0.2 Pa, and
  acceleration voltage (bias voltage): ground to −100 V.

The thus obtained golden decorative piece consists of the base material for decorative piece (stainless steel), the golden hard coating (hafnium nitride: 1.0 μm coating thickness) and the golden outermost coating (gold-palladium alloy: 0.03 μm coating thickness).

(Evaluation)

In the same manner as in Example 2-1, the obtained golden decorative piece was evaluated with respect to (1) the marring evaluation, (2) corrosion resistance test and (3) coloration test. The results are shown in Table 2-1.

Example 2-3

(Production of Golden Decorative Piece)

In the same conditions as in Example 2-1, a base material for watchcase on its surface was provided with a hafnium nitride plated coating (golden hard coating).

Thereafter, a pure gold coating (golden outermost coating) having a thickness of 0.03 μm was formed on the surface of the hafnium nitride plated coating by a sputtering method under the following coating formation conditions. As a result, a golden watchcase with the color tone 1N-14 in terms of Swiss gold plating color standards was obtained.

The color tone thereof was $L^*$:85.01, $a^*$:4.12 and $b^*$:26.02.

<Coating Formation Condition> sputtering target: gold, gold,
sputtering electric power: 1 kW,
gas: argon,
coating formation pressure: 0.2 Pa, and
acceleration voltage (bias voltage): ground to −100 V.

The thus obtained golden decorative piece consists of the base material for decorative piece (stainless steel), the golden hard coating (hafnium nitride: 1.0 μm coating thickness) and the golden outermost coating (pure gold: 0.03 μm coating thickness).

(Evaluation)

In the same manner as in Example 2-1, the obtained golden decorative piece was evaluated with respect to (1) the marring evaluation, (2) corrosion resistance test and (3) coloration test. The results are shown in Table 2-1.

Example 2-4

(Production of Golden Decorative Piece)

A titanium nitride plated coating with dark yellow color tone (golden hard coating) having a thickness of 1.0 μm was formed on the surface of a base material for watchcase produced in the same conditions as in Example 2-1 by an ion plating method (hot cathode method) under the following coating formation conditions.

<Coating Formation Condition> vapor source: titanium,
electron gun: 10 kV, 300 mA
gas: argon, nitrogen,
coating formation pressure: 0.02 Pa,
acceleration voltage (bias voltage): ground to −100 V,
anode voltage: 60 V, and
filament voltage: 7 V.

Thereafter, a gold/nickel mixture plated coating with golden color tone (golden outermost coating) having a thickness of 0.03 μm was formed on the surface of the titanium nitride plated coating superimposed on the surface of the base material under the same conditions as in Example 2-1. As a result, a watchcase having a dark golden color tone was obtained.

The color tone thereof was $L^*$:82.37, $a^*$:5.04 and $b^*$:26.87.

In the same manner as in Example 2-1, the reflectance with reference to wavelength of the golden decorative piece is shown in FIG. 2-1.

The thus obtained golden decorative piece consists of the base material for decorative piece (stainless steel), the golden hard coating (titanium nitride: 1.0 μm coating thickness) and the golden outermost coating (gold-nickel alloy: 0.03 μm coating thickness).

(Evaluation)

In the same manner as in Example 2-1, the obtained golden decorative piece was evaluated with respect to (1) the marring evaluation, (2) corrosion resistance test and (3) coloration test. The results are shown in Table 2-2.

Example 2-5

(Production of Golden Decorative Piece)

In the same conditions as in Example 2-4, a base material for watchcase on its surface was provided with a titanium nitride plated coating (golden hard coating).

Thereafter, a gold/palladium mixture plated coating with golden color tone (golden outermost coating) having a thickness of 0.03 μm was formed on the surface of the titanium nitride plated coating under the same conditions as in Example 2-2, thereby obtaining a watchcase with dark golden color tone.

The color tone thereof was $L^*$:82.04, $a^*$:5.41 and $b^*$:15.43.

The thus obtained golden decorative piece consists of the base material for decorative piece (stainless steel), the golden hard coating (titanium nitride: 1.0 μm coating thickness) and the golden outermost coating (gold-palladium alloy: 0.03 μm coating thickness).

(Evaluation)

In the same manner as in Example 2-1, the obtained golden decorative piece was evaluated with respect to (1) the marring evaluation, (2) corrosion resistance test and (3) coloration test. The results are shown in Table 2-2.

Example 2-6

(Production of Golden Decorative Piece)

In the same conditions as in Example 2-4, a base material for watchcase on its surface was provided with a titanium nitride plated coating (golden hard coating).

Thereafter, a pure gold coating (golden outermost coating) having a thickness of 0.03 μm was formed on the surface of the titanium nitride plated coating under the same conditions as in Example 2-3. As a result, a watchcase with dark golden color tone was obtained.

The color tone thereof was $L^*$:82.88, $a^*$:4.44 and $b^*$:27.43.

The thus obtained golden decorative piece consists of the base material for decorative piece (stainless steel), the golden hard coating (titanium nitride: 1.0 μm coating thickness) and the golden outermost coating (pure gold: 0.03 μm coating thickness).

(Evaluation)

In the same manner as in Example 2-1, the obtained golden decorative piece was evaluated with respect to (1) the marring evaluation, (2) corrosion resistance test and (3) coloration test. The results are shown in Table 2-2.

Example 2-7

(Production of Golden Decorative Piece)

In the same conditions as in Example 2-1, a base material for watchcase on its surface was provided with a hafnium nitride plated coating (golden hard coating).

Thereafter, a gold/iron mixture plated coating with golden color tone (golden outermost coating) having a thickness of 0.03 μm was formed on the surface of the hafnium nitride plated coating by a sputtering method under the following coating formation conditions. As a result, a golden watchcase with the color tone 1N-14 in terms of Swiss gold plating color standards was obtained.

The thus obtained golden decorative piece consists of the base material for decorative piece (stainless steel), the golden hard coating (hafnium nitride: 1.0 µm coating thickness) and the golden outermost coating (gold-iron alloy: 0.03 µm coating thickness).

<Coating Formation Condition>
 sputtering target: gold, iron, alloy,
 sputtering electric power: 1 kW,
 gas: argon,
 coating formation pressure: 0.2 Pa, and
 acceleration voltage (bias voltage): ground to −100 V.
(Evaluation)

In the same manner as in Example 2-1, the obtained golden decorative piece was evaluated with respect to (1) the marring evaluation, (2) corrosion resistance test and (3) coloration test. The results are shown in Table 2-2.

Examples 2-8 to 2-11 and Comparative Examples 2-1 to 2-2

(Production of Golden Decorative Piece)
In the same conditions as in Example 2-1, a base material for watchcase on its surface was provided with a hafnium nitride plated coating (golden hard coating).

Thereafter, each of gold/nickel mixture plated coatings with golden color tone (golden outermost coatings) having thicknesses of 0.01, 0.02, 0.03, 0.04, 0.05 and 0.06 µm was formed on the surface of the hafnium nitride plated coating under the same conditions as in Example 2-1. As a result, watchcases with golden color tone were obtained.

Each of the thus obtained golden decorative pieces consists of the base material for decorative piece (stainless steel), the golden hard coating (hafnium nitride: 1.0 µm coating thickness) and the golden outermost coating (gold-nickel alloy: 0.01-0.06 µm coating thickness).

(Evaluation)
In the same manner as in Example 2-1, the obtained golden decorative pieces (Examples 2-8 to 2-11 and Comparative Examples 2-1 to 2-2) were evaluated with respect to (1) the marring evaluation, (2) corrosion resistance test and (3) coloration test. The results are shown in Table 2-3.

Furthermore, these golden decorative pieces (Examples 2-8 to 2-11 and Comparative Examples 2-1 to 2-2) were also evaluated with respect to the following hardness (4) and adhesion test (5). The results thereof are also shown in Table 2-3.

(4) Hardness
The surface hardness (HV) of each of the obtained golden decorative pieces (Examples 2-8 to 2-11 and Comparative Examples 2-1 to 2-2) was measured with a load of 5 mN held for 10 sec. using a hardness meter (Fischer Scope (registered trade name) H100) manufactured by Fisher Technology Inc.) and evaluated on the following criteria.
 ⊚: hardness 2000 (HV)
 ○: hardness 1400 to below 2000 (HV)
 ▲: hardness 1000 to below 1400 (HV)
 x: below 1000 (HV)

(5) Adhesion Test
A commercially available pressure sensitive adhesive tape of given area (2.3 cm 5.0 cm) was stuck on the surface of each of the obtained golden decorative pieces (Examples 2-8 to 2-11 and Comparative Examples 2-1 to 2-2) and peeled. Thereafter, the condition of tape adhesive surface was evaluated on the following criteria.

○: no adhesion of a coating from the surface of golden decorative piece
 x: there is adhesion of a coating from the surface of golden decorative piece Examples 2-12 to 2-15 and Comparative Examples 2-3 to 2-4

(Production of Golden Decorative Piece)
In the same conditions as in Example 2-4, a base material for watchcase on its surface was provided with a titanium nitride plated coating (golden hard coating).

Thereafter, each of gold/nickel mixture plated coatings with golden color tone (golden outermost coatings) having thicknesses of 0.01, 0.02, 0.03, 0.04, 0.05 and 0.06 µm was formed on the surface of the titanium nitride plated coating under the same conditions as in Example 2-1. As a result, watchcases with dark golden color tone were obtained.

Each of the thus obtained golden decorative pieces consists of the base material for decorative piece (stainless steel), the golden hard coating (titanium nitride: 1.0 µm coating thickness) and the golden outermost coating (gold-nickel alloy: 0.01-0.06 µm coating thickness).

(Evaluation)
In the same manner as in Examples 2-8 to 2-11 and Comparative Examples 2-1 to 2-2, the obtained golden decorative pieces (Examples 2-12 to 2-15 and Comparative Examples 2-3 to 2-4) were evaluated with respect to (1) the marring evaluation, (2) corrosion resistance test, (3) coloration test, (4) hardness and (5) adhesion test. The results are shown in Table 2-4.

Examples 2-16 to 2-19 and Comparative Examples 2-5 to 2-6

(Production of Golden Decorative Piece)
In the same conditions as in Example 2-1, a base material for watchcase on its surface was provided with a hafnium nitride plated coating (golden hard coating).

Thereafter, each of gold/iron mixture plated coatings with golden color tone (golden outermost coatings) having thicknesses of 0.01, 0.02, 0.03, 0.04, 0.05 and 0.06 µm was formed on the surface of the hafnium nitride plated coating under the same conditions as in Example 2-7. As a result, watchcases with golden color tone were obtained.

Each of the thus obtained golden decorative pieces consists of the base material for decorative piece (stainless steel), the golden hard coating (hafnium nitride: 1.0 µm coating thickness) and the golden outermost coating (gold-iron alloy: 0.01-0.06 µm coating thickness).

(Evaluation)
In the same manner as in Examples 2-8 to 2-11 and Comparative Examples 2-1 to 2-2, the obtained golden decorative pieces (Examples 2-16 to 2-19 and Comparative Examples 2-5 to 2-6) were evaluated with respect to (1) the marring evaluation, (2) corrosion resistance test, (3) coloration test, (4) hardness and (5) adhesion test. The results are shown in Table 2-5.

Examples 2-20 to 2-23 and Comparative Examples 2-7 to 2-8

(Production of Golden Decorative Piece)
A 1.0 µm thick zirconium nitride plated coating with golden color tone (golden hard coating) was formed on the surface of a base material for watchcase produced in the same conditions as in Example 2-1 by a sputtering method under the following coating formation conditions.

<Coating Formation Condition>
sputtering target: zirconium,
sputtering electric power: 5 kW,
gas: argon, nitrogen,
coating formation pressure: 0.2 Pa, and
acceleration voltage (bias voltage): ground to −100 V.

Thereafter, each of gold/nickel mixture plated coatings with golden color tone (golden outermost coatings) having thicknesses of 0.01, 0.02, 0.03, 0.04, 0.05 and 0.06 μm was formed on the surface of the zirconium nitride plated coating under the same conditions as in Example 2-1. As a result, watchcases with golden color tone were obtained.

When the golden outermost coating had a thickness of 0.03 μm (Example 2-22), the color tone thereof was L*:84.05, a*:3.51 and b*:26.43.

Each of the thus obtained golden decorative pieces consists of the base material for decorative piece (stainless steel), the golden hard coating (zirconium nitride: 1.0 μm coating thickness) and the golden outermost coating (gold-nickel alloy: 0.01-0.06 μm coating thickness).

(Evaluation)

In the same manner as in Examples 2-8 to 2-11 and Comparative Examples 2-1 to 2-2, the obtained golden decorative pieces (Examples 2-20 to 2-23 and Comparative Examples 2-7 to 2-8) were evaluated with respect to (1) the marring evaluation, (2) corrosion resistance test, (3) coloration test, (4) hardness and (5) adhesion test. The results are shown in Table 2-6.

Examples 2-24 to 2-27 and Comparative Examples 2-9 to 2-10

(Production of Golden Decorative Piece)

In the same conditions as in Example 2-1, a base material for watchcase on its surface was provided with a hafnium nitride plated coating (golden hard coating).

Thereafter, each of gold/palladium mixture plated coatings with golden color tone (golden outermost coatings) having thicknesses of 0.01, 0.02, 0.03, 0.04, 0.05 and 0.06 μm was formed on the surface of the hafnium nitride plated coating under the same conditions as in Example 2-5. As a result, watchcases with golden color tone were obtained.

Each of the thus obtained golden decorative pieces consists of the base material for decorative piece (stainless steel), the golden hard coating (hafnium nitride: 1.0 μm coating thickness) and the golden outermost coating (gold-palladium alloy: 0.01-0.06 μm coating thickness).

(Evaluation)

In the same manner as in Examples 2-8 to 2-11 and Comparative Examples 2-1 to 2-2, the obtained golden decorative pieces (Examples 2-24 to 2-27 and Comparative Examples 2-9 to 2-10) were evaluated with respect to (1) the marring evaluation, (2) corrosion resistance test, (3) coloration test, (4) hardness and (5) adhesion test. The results are shown in Table 2-7.

Examples 2-28 to 2-31 and Comparative Examples 2-11 to 2-12

(Production of Golden Decorative Piece)

A 0.8 μm thick titanium nitride plated coating with dark yellow color tone (second hard coating) was formed on the surface of a base material for watchcase produced in the same conditions as in Example 2-1 by a sputtering method under the following coating formation conditions.

<Coating Formation Condition>
sputtering target: titanium,
sputtering electric power: 5 kW,
gas: argon, nitrogen,
coating formation pressure: 0.2 Pa, and
acceleration voltage (bias voltage): ground to −100 V.

Thereafter, in the same conditions as in Example 2-1, a hafnium nitride plated coating (golden hard coating) was formed on the surface of the titanium nitride plated coating.

Further, each of gold/nickel mixture plated coatings with golden color tone (golden outermost coatings) having thicknesses of 0.01, 0.02, 0.03, 0.04, 0.05 and 0.06 μm was formed on the surface of the hafnium nitride plated coating under the same conditions as in Example 2-1. As a result, watchcases with golden color tone were obtained.

Each of the thus obtained golden decorative pieces consists of the base material for decorative piece (stainless steel), the second hard coating (titanium nitride: 0.8 μm coating thickness), the golden hard coating (hafnium nitride: 0.2 μm coating thickness) and the golden outermost coating (gold-nickel alloy: 0.01-0.06 μm coating thickness).

(Evaluation)

In the same manner as in Examples 2-8 to 2-11 and Comparative Examples 2-1 to 2-2, the obtained golden decorative pieces (Examples 2-28 to 2-31 and Comparative Examples 2-11 to 2-12) were evaluated with respect to (1) the marring evaluation, (2) corrosion resistance test, (3) coloration test, (4) hardness and (5) adhesion test. The results are shown in Table 2-8.

Examples 2-32 to 2-35 and Comparative Examples 2-13 to 2-14

(Production of Golden Decorative Piece)

A 0.2 μm thick titanium plated coating (undercoat layer) was formed on the surface of a base material for watchcase produced in the same conditions as in Example 2-1 by a sputtering method under the following coating formation conditions.

<Coating Formation Condition>
sputtering target: titanium,
sputtering electric power: 5 kW,
gas: argon, nitrogen,
coating formation pressure: 0.2 Pa, and
acceleration voltage (bias voltage): ground to −100 V.

Thereafter, in the same conditions as in Examples 2-28 to 2-31 and Comparative Examples 2-11 to 2-12, a titanium nitride plated coating (second hard coating) was formed on the surface of the titanium plated coating.

Subsequently, in the same conditions as in Example 2-1, a 0.2 μm hafnium nitride plated coating (golden hard coating) was formed on the surface of the titanium, nitride plated coating.

Further, each of gold/nickel mixture plated coatings with golden color tone (golden outermost coatings) having thicknesses of 0.01, 0.02, 0.03, 0.04, 0.05 and 0.06 μm was formed on the surface of the hafnium nitride plated coating under the same conditions as in Example 2-1. As a result, watchcases with golden color tone were obtained.

Each of the thus obtained golden decorative pieces consists of the base material for decorative piece (stainless steel), the undercoat layer (titanium: 0.2 μm coating thickness), the second hard coating (titanium nitride: 0.8 μm coating thickness), the golden hard coating (hafnium nitride: 0.2 μm coating thickness) and the golden outermost coating (gold-nickel alloy: 0.01-0.06 μm coating thickness).

(Evaluation)

In the same manner as in Examples 2-8 to 2-11 and Comparative Examples 2-1 to 2-2, the obtained golden decorative pieces (Examples 2-32 to 2-35 and Comparative Examples 2-13 to 2-14) were evaluated with respect to (1) the marring evaluation, (2) corrosion resistance test, (3) coloration test, (4) hardness and (5) adhesion test. The results are shown in Table 2-9.

Examples 2-36 to 2-39 and Comparative Examples 2-15 to 2-16

(Production of Golden Decorative Piece)

A 0.2 μm thick titanium carbide plated coating with white color tone (second hard coating) was formed on the surface of a base material for watchcase produced in the same conditions as in Example 2-1 by a sputtering method under the following coating formation conditions.

<Coating Formation Condition>
sputtering target: titanium,
sputtering electric power: 5 kW,
gas: argon, hydrocarbon gas,
coating formation pressure: 0.2 Pa, and
acceleration voltage (bias voltage): ground to −100 V.

Thereafter, in the same conditions as in Example 2-1, a 0.2 μm hafnium nitride plated coating (golden hard coating) was formed on the surface of the titanium carbide plated coating.

Further, each of gold/nickel mixture plated coatings with golden color tone (golden outermost coatings) having thicknesses of 0.01, 0.02, 0.03, 0.04, 0.05 and 0.06 μm was formed on the surface of the hafnium nitride plated coating under the same conditions as in Example 2-1. As a result, watchcases with golden color tone were obtained.

Each of the thus obtained golden decorative pieces consists of the base material for decorative piece (stainless steel), the second hard coating (titanium carbide: 0.8 μm coating thickness), the golden hard coating (hafnium nitride: 0.2 μm coating thickness) and the golden outermost coating (gold-nickel alloy: 0.01-0.06 μm coating thickness).

(Evaluation)

In the same manner as in Examples 2-8 to 2-11 and Comparative Examples 2-1 to 2-2, the obtained golden decorative pieces (Examples 2-36 to 2-39 and Comparative Examples 2-15 to 2-16) were evaluated with respect to (1) the marring evaluation, (2) corrosion resistance test, (3) coloration test, (4) hardness and (5) adhesion test. The results are shown in Table 2-10.

TABLE 2-1

|  | Example 2-1 HfN/(Au—Ni) | Example 2-2 HfN/(Au—Pd) | Example 2-3 HfN/Au |
|---|---|---|---|
| (1) Blemish | ○ | ○ | ○ |
| (2) Corrosion resistance | ○ | ○ | ▲ |
| (3) Coloration | ◎ | ○ | ◎ |

TABLE 2-2

|  | Example 2-4 TiN/(Au—Ni) | Example 2-5 TiN/(Au—Pd) | Example 2-6 TiN/Au | Example 2-7 HfN/(Au—Fe) |
|---|---|---|---|---|
| (1) Blemish | ○ | ○ | ○ | ○ |
| (2) Corrosion resistance | ○ | ○ | ▲ | X |
| (3) Coloration | X | X | ▲ | ○ |

TABLE 2-3

<HfN/(Au—Ni)>

|  | Example 2-8 | Example 2-9 | Example 2-10 | Example 2-11 | Comp. Ex. 2-1 | Comp. Ex. 2-2 |
|---|---|---|---|---|---|---|
| Au—Ni thickness(μm) | 0.01 | 0.02 | 0.03 | 0.04 | 0.05 | 0.06 |
| (1) Blemish | ○ | ○ | ○ | ▲ | X | X |
| (2) Corrosion resistance | ▲ | ○ | ○ | ○ | ○ | ○ |
| (3) Coloration | ▲ | ◎ | ◎ | ◎ | ○ | ○ |
| (4) Hardness | ○ | ○ | ○ | ○ | ○ | ○ |
| (5) Adhesion | ○ | ○ | ○ | ○ | ○ | ○ |

TABLE 2-4

<TiN/(Au—Ni)>

|  | Example 2-12 | Example 2-13 | Example 2-14 | Example 2-15 | Comp. Ex. 2-3 | Comp. Ex. 2-4 |
|---|---|---|---|---|---|---|
| Au—Ni thickness(μm) | 0.01 | 0.02 | 0.03 | 0.04 | 0.05 | 0.06 |
| (1) Blemish | ○ | ○ | ○ | ▲ | X | X |
| (2) Corrosion resistance | ▲ | ○ | ○ | ○ | ○ | ○ |
| (3) Coloration | X | X | X | ▲ | ▲ | ▲ |
| (4) Hardness | ○ | ○ | ○ | ○ | ○ | ○ |
| (5) Adhesion | ○ | ○ | ○ | ○ | ○ | ○ |

TABLE 2-5

| <HfN/(Au—Fe)> | | | | | | |
|---|---|---|---|---|---|---|
| | Example 2-16 | Example 2-17 | Example 2-18 | Example 2-19 | Comp. Ex. 2-5 | Comp. Ex. 2-6 |
| Au—Fe thickness(μm) | 0.01 | 0.02 | 0.03 | 0.04 | 0.05 | 0.06 |
| (1) Blemish | ○ | ○ | ○ | ▲ | X | X |
| (2) Corrosion resistance | X | X | X | ○ | ○ | ○ |
| (3) Coloration | ▲ | ○ | ○ | ○ | ○ | ○ |
| (4) Hardness | ○ | ○ | ○ | ○ | ○ | ○ |
| (5) Adhesion | ○ | ○ | ○ | ○ | ○ | ○ |

TABLE 2-6

| <ZrN/(Au—Ni)> | | | | | | |
|---|---|---|---|---|---|---|
| | Example 2-20 | Example 2-21 | Example 2-22 | Example 2-23 | Comp. Ex. 2-7 | Comp. Ex. 2-8 |
| Au—Ni thickness(μm) | 0.01 | 0.02 | 0.03 | 0.04 | 0.05 | 0.06 |
| (1) Blemish | ○ | ○ | ○ | ▲ | X | X |
| (2) Corrosion resistance | ▲ | ○ | ○ | ○ | ○ | ○ |
| (3) Coloration | ▲ | ○ | ○ | ○ | ○ | ○ |
| (4) Hardness | ○ | ○ | ○ | ○ | ○ | ○ |
| (5) Adhesion | ○ | ○ | ○ | ○ | ○ | ○ |

TABLE 2-7

| <HfN/(Au—Pd)> | | | | | | |
|---|---|---|---|---|---|---|
| | Example 2-24 | Example 2-25 | Example 2-26 | Example 2-27 | Comp. Ex. 2-9 | Comp. Ex. 2-10 |
| Au—Pd thickness(μm) | 0.01 | 0.02 | 0.03 | 0.04 | 0.05 | 0.06 |
| (1) Blemish | ○ | ○ | ○ | ▲ | X | X |
| (2) Corrosion resistance | ▲ | ○ | ○ | ○ | ○ | ○ |
| (3) Coloration | ▲ | ▲ | ○ | ○ | ○ | ○ |
| (4) Hardness | ○ | ○ | ○ | ○ | ○ | ○ |
| (5) Adhesion | ○ | ○ | ○ | ○ | ○ | ○ |

TABLE 2-8

| <TiN/HfN/(Au—Ni)> | | | | | | |
|---|---|---|---|---|---|---|
| | Example 2-28 | Example 2-29 | Example 2-30 | Example 2-31 | Comp. Ex. 2-11 | Comp. Ex. 2-12 |
| Au—Ni thickness(μm) | 0.01 | 0.02 | 0.03 | 0.04 | 0.05 | 0.06 |
| (1) Blemish | ◉ | ○ | ○ | ▲ | X | X |
| (2) Corrosion resistance | ▲ | ○ | ○ | ○ | ○ | ○ |
| (3) Coloration | ▲ | ◉ | ◉ | ◉ | ○ | ○ |
| (4) Hardness | ◉ | ◉ | ◉ | ◉ | ◉ | ◉ |
| (5) Adhesion | ○ | ○ | ○ | ○ | ○ | ○ |

TABLE 2-9

| <Ti/TiN/HfN/(Au—Ni)> | | | | | | |
|---|---|---|---|---|---|---|
| | Example 2-32 | Example 2-33 | Example 2-34 | Example 2-35 | Comp. Ex. 2-13 | Comp. Ex. 2-14 |
| Au—Ni thickness(μm) | 0.01 | 0.02 | 0.03 | 0.04 | 0.05 | 0.06 |
| (1) Blemish | ◉ | ○ | ○ | ▲ | X | X |
| (2) Corrosion resistance | ▲ | ○ | ○ | ○ | ○ | ○ |
| (3) Coloration | ▲ | ◉ | ◉ | ◉ | ○ | ○ |

TABLE 2-9-continued

<Ti/TiN/HfN/(Au—Ni)>

|  | Example 2-32 | Example 2-33 | Example 2-34 | Example 2-35 | Comp. Ex. 2-13 | Comp. Ex. 2-14 |
|---|---|---|---|---|---|---|
| (4) Hardness | ◎ | ◎ | ◎ | ◎ | ◎ | ◎ |
| (5) Adhesion | ◎ | ◎ | ◎ | ◎ | ◎ | ◎ |

TABLE 2-10

<TiC/HfN/(Au—Ni)>

|  | Example 2-36 | Example 2-37 | Example 2-38 | Example 2-39 | Comp. Ex. 2-15 | Comp. Ex. 2-16 |
|---|---|---|---|---|---|---|
| Au—Ni thickness(μm) | 0.01 | 0.02 | 0.03 | 0.04 | 0.05 | 0.06 |
| (1) Blemish | ◎ | ○ | ○ | ▲ | X | X |
| (2) Corrosion resistance | ▲ | ○ | ○ | ○ | ○ | ○ |
| (3) Coloration | ▲ | ◎ | ◎ | ◎ | ○ | ○ |
| (4) Hardness | ◎ | ◎ | ◎ | ◎ | ◎ | ◎ |
| (5) Adhesion | ○ | ○ | ○ | ○ | ○ | ○ |

(The above relates to the embodiments of the second invention.)

The invention claimed is:

1. A decorative part comprising a hardening layer provided at its surface, wherein the hardening layer includes an undercoat layer and a top layer, and wherein the undercoat layer includes a metal layer of at least one metal selected from among Hf, Ti and Zr, a first nitride layer of the same metal as that constituting the metal layer superimposed on the metal layer and, superimposed on the first nitride layer, a second nitride layer of at least one metal selected from among Hf, Ti and Zr differing from the first nitride layer.

2. The decorative part according to claim 1, wherein the top layer is an Au alloy layer.

3. The decorative part according to claim 1, wherein the top layer includes a layer of a mixture of an Au alloy and a nitride of at least one element selected from the group consisting of Hf, Ti and Zr, wherein the nitride is the same as that constituting the second nitride layer and, superimposed on the mixture layer, an Au alloy layer.

4. The decorative part according to claim 2, wherein the Au alloy layer is composed mainly of an Au—Ni alloy, Au—Pd alloy or Au—Pt alloy.

5. A decorative part comprising:
a base material for decorative piece,
an undercoat layer provided on the base material for decorative piece,
a second hard coating provided on the undercoat layer,
a golden hard coating exhibiting a golden color tone provided on the second hard coating, and
a golden outermost coating comprising gold (Au) or gold alloy exhibiting a golden color tone provided on the golden hard coating,
wherein the thickness of the second hard coating is greater than that of the golden hard coating,
wherein the golden hard coating is harder than the golden outermost coating, and
wherein the golden outermost coating has a thickness of 0.02 to 0.04 μm.

6. The decorative part according to claim 5, wherein the golden hard coating comprises hafnium nitride (HfN) or zirconium nitride (ZrN).

7. The decorative part according to claim 5, wherein the golden outermost coating contains as a major component at least one member selected from the group consisting of a gold-nickel (Au—Ni) alloy, a gold-palladium (Au—Pd) alloy, a gold-platinum (Au—Pt) alloy and a gold-rhodium (Au—Rh) alloy.

8. The decorative part according to claim 7, wherein the second hard coating contains as a major component a nitride, carbide or carbonitride of at least one element selected from the group consisting of titanium (Ti), chromium (Cr), zirconium (Zr), hafnium (Hf), vanadium (V), niobium (Nb) and tantalum (Ta).

9. The decorative part according to claim 7, wherein the second hard coating comprises titanium nitride (TiN), and the golden hard coating comprises hafnium nitride (HfN).

10. The decorative part according to claim 5, wherein the undercoat layer contains as a major component at least one element selected from the group consisting of titanium (Ti), chromium (Cr), zirconium (Zr), hafnium (Hf), vanadium (V), niobium (Nb) and tantalum (Ta), the element being the same as that contained in the second hard coating.

11. The decorative part according to claim 5, wherein the undercoat layer comprises titanium (Ti), and the second hard coating comprises titanium nitride (TiN).

12. A process for producing a decorative part furnished as a golden outermost coating with a coating of gold (Au) or gold alloy exhibiting a golden color tone by the use of a dry plating method, which process comprises:
[1] the step of producing a base material for decorative piece from a metal or ceramic material by the use of various machining means,
[2] the step of forming an undercoat layer on a surface of the base material for decorative piece by the use of a dry plating method,
[3] the step of forming a second hard coating on a surface of the undercoat layer by the use of a dry plating method,
[4] the step of forming a golden hard coating on a surface of the second hard coating by the use of a dry plating method, and
[5] the step of forming a golden outermost coating of gold (Au) or gold alloy on the surface of the golden hard coating by the use of a dry plating method,
wherein the second hard coating is formed so as to have a thickness greater than that of the golden hard coating,
wherein the golden hard coating is formed so as to be harder than the golden outermost coating, and
wherein the golden outermost coating is formed so as to have a thickness of 0.02 to 0.04 μm.

* * * * *